(12) United States Patent
Hosokawa et al.

(10) Patent No.: US 7,298,035 B2
(45) Date of Patent: Nov. 20, 2007

(54) SEMICONDUCTOR DEVICE AND A METHOD OF ASSEMBLING A SEMICONDUCTOR DEVICE

(75) Inventors: Ryuji Hosokawa, Kanagawa (JP); Takashi Imoto, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 210 days.

(21) Appl. No.: 11/216,144

(22) Filed: Sep. 1, 2005

(65) Prior Publication Data

US 2006/0055061 A1    Mar. 16, 2006

(30) Foreign Application Priority Data

Sep. 2, 2004    (JP) ............................ P2004-256022

(51) Int. Cl.
*H01L 21/58* (2006.01)
(52) U.S. Cl. ...................... 257/686; 257/698; 257/777; 257/E23.011; 257/E23.067; 257/E23.174
(58) Field of Classification Search ................ 257/686, 257/698, 777, E23.011, E23.067, E23.174
See application file for complete search history.

(56) References Cited

U.S. PATENT DOCUMENTS

| | | | |
|---|---|---|---|
| 6,747,361 B2 | 6/2004 | Ichinose | |
| 2002/0089050 A1* | 7/2002 | Michii et al. | ............... 257/686 |
| 2002/0171145 A1 | 11/2002 | Higuchi et al. | |
| 2004/0207056 A1 | 10/2004 | Seki et al. | |
| 2005/0017342 A1* | 1/2005 | Morrison | ..................... 257/691 |
| 2005/0073035 A1* | 4/2005 | Moxham | .................... 257/678 |

* cited by examiner

*Primary Examiner*—George Fourson
(74) *Attorney, Agent, or Firm*—Finnegan, Henderson, Farabow, Garrett & Dunner, L.L.P.

(57) ABSTRACT

A semiconductor device includes a substrate having first and second surfaces, the substrate having an opening; a first adhesive layer provided on the first surface; a second adhesive layer provided under the second surface; a third adhesive layer provided around the opening; a semiconductor chip arranging a plurality of chip bonding pads in a central portion of the semiconductor chip and adhered on the third adhesive layer; substrate bonding pads adhered under the second adhesive layer; bonding wires connecting the chip bonding pads to the substrate bonding pads; and an encapsulating resin provided around the semiconductor chip.

9 Claims, 24 Drawing Sheets

SEMICONDUCTOR DEVICE AND A METHOD OF ASSEMBLING A SEMICONDUCTOR DEVICE

CROSS REFERENCE TO RELATED APPLICATIONS AND INCORPORATION BY REFERENCE

This application is based upon and claims the benefit of priority from the prior Japanese Patent Applications No. P2004-256022, filed on Sep. 2, 2004; the entire contents of which are incorporated herein by reference.

BACKGROUND OF THE INVENTION

1. Field of the Invention

The present invention relates to a semiconductor device, more specifically to a semiconductor device and an assembling method for a ball grid array package.

2. Description of the Related Art

With move to higher levels of integration and improved functions of electric devices in recent years, semiconductor chips in semiconductor devices are shrinking in geometrical size, growing the degree of on-chip integration, and improving their performance. With respect to mounting technology of the semiconductor chips, a surface-mount package (SMP), such as a ball grid array (BGA), and a chip scale or chip size package (CSP) has been developed in addition to a lead-insertion package.

The surface-mount package has outer connection balls serving as electrodes arranged in an array on a bottom surface of a base substrate. A semiconductor chip provided on an upper surface of the base substrate is electrically connected to the outer connection balls. For example, a product having a semiconductor chip provided on a polyimide substrate with high heat resistance, an encapsulating resin encapsulating the semiconductor chip, and a plurality of solder balls provided on a bottom side of the polyimide substrate is widely known. In addition, a miniaturization technology of wiring boards, such as tapes and printed wiring boards, which have fine wiring patterns, has been developed to mount a miniaturized semiconductor chip thereon. A technology for a build-up wiring board having multi-lever interconnects has also been developed.

Recently, in the field of a micro-ball grid array packages, a semiconductor chip mounted on a base substrate has become extremely smaller than the base substrate. A few lines of outer connection electrodes are arranged outside of the chip mounting area. The base substrate may warp due to heat stress that occurs during the formation of the outer connection electrodes on the bottom side of the board, and it is difficult to connect solder balls to the outer connection electrodes. To maintain planarity of the base substrate, encapsulating resin, which encapsulates the semiconductor chip, is provided on the base substrate.

SUMMARY OF THE INVENTION

An aspect of the present invention inheres in a semiconductor device encompassing a substrate having a first surface and a second surface opposite to the first surface, the substrate having an opening penetrating from the first surface to the second surface; a first adhesive layer provided on the first surface; a second adhesive layer provided under the second surface; a third adhesive layer provided around the opening and adhered on the first adhesive layer; a semiconductor chip arranging a plurality of chip bonding pads in a central portion of the semiconductor chip, a perimeter of the semiconductor chip surrounding the central portion is adhered on the third adhesive layer so as to expose the chip bonding pads through the opening; a plurality of substrate bonding pads adhered under the second adhesive layer; a plurality of bonding wires connecting the chip bonding pads to the substrate bonding pads; and an encapsulating resin provided around the bonding wires and the semiconductor.

Another aspect of the present invention inheres in a method of assembling a semiconductor device encompassing providing a first adhesive layer on a first surface of a substrate, the substrate being defined by the first surface and a second surface opposing the first surface and having an opening penetrating from the first surface to the second surface; providing a second adhesive layer under the second surface providing a third adhesive layer around the opening on the first adhesive layer; adhering a semiconductor chip on the third adhesive layer so that a plurality of chip bonding pads provided in a central portion at a top surface of the semiconductor chip is exposed to the opening; providing a plurality of the substrate bonding pads on the second adhesive layer; connecting the chip bonding pads to the substrate bonding pads by bonding wires; and encapsulating the bonding wires and the semiconductor chip with a encapsulating resin.

DETAILED DESCRIPTION OF THE INVENTION

Figure 1:
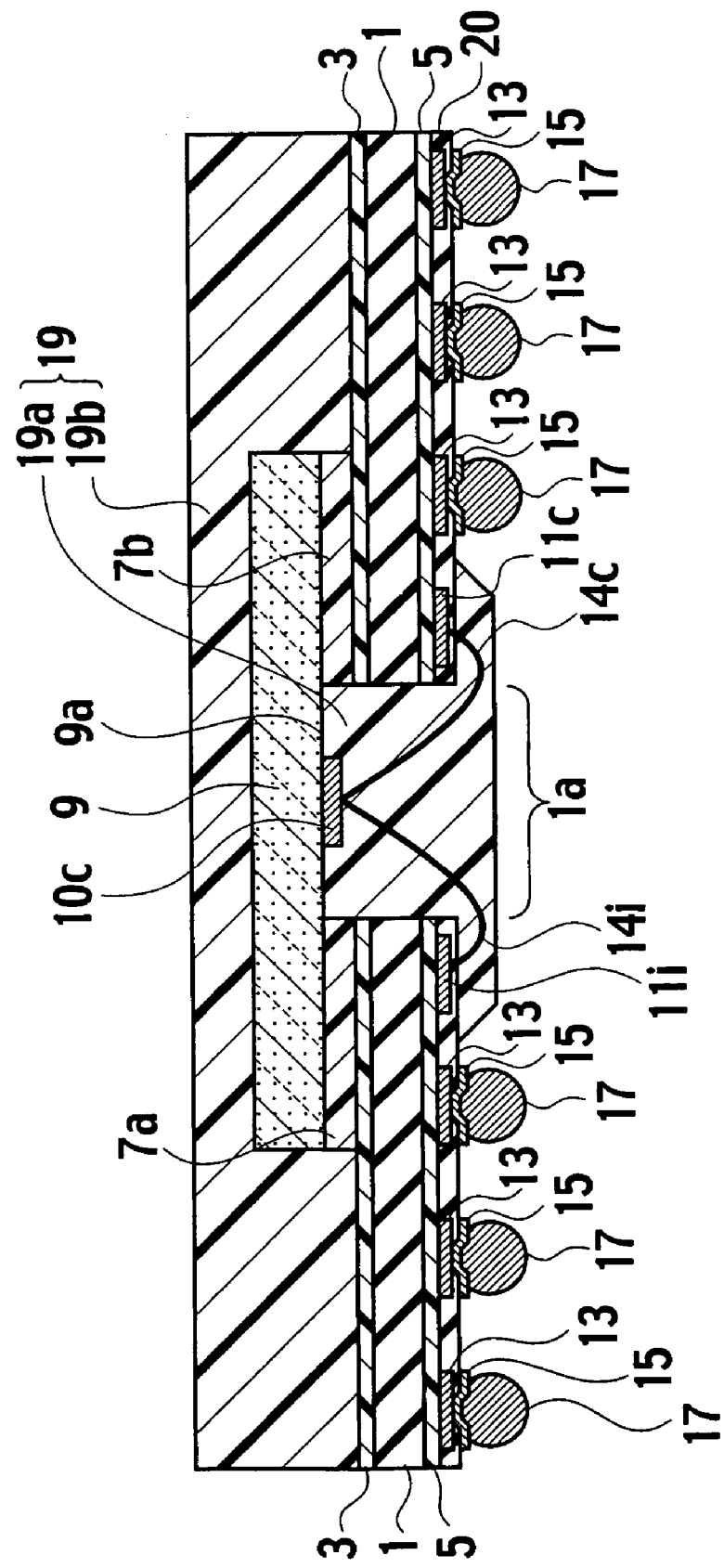
FIG. 1 is a cross-sectional view taken on line I-I in FIG. 2, and illustrating a semiconductor device according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. In the following descriptions, numerous details are set forth such as specific signal values, etc. to provide a thorough understanding of the present invention. However, it will be obvious to those skilled in the art that the present invention may be practiced without such specific details. Prepositions, such as "on", "over", "under", "beneath" and "normal" are defined with respect to a planar surface of a substrate, regardless of the orientation in which the substrate is actually held. A layer is on another layer even if there are intervening layers.

First Embodiment

As shown in FIG. 1, a semiconductor device according to a first embodiment of the present invention includes a substrate 1 defined by a first surface and a second surface opposite to the first surface. A first adhesive layer 3 is provided on the first surface. A second adhesive layer 5 is provided on the second surface. Third adhesive layers 7a and 7b are adhered to the first adhesive layer 3. A semiconductor chip 9 is adhered to the third adhesive layers 7a and 7b. An encapsulating resin (a second encapsulating resin) 19 provided on the third adhesive layers 7a and 7b encapsulates the semiconductor chip 9.

Here, the "first surface" refers to one of a surface having a substantially planarized area. The "second surface" refers to a surface opposing to the first surface. In other words, the first and second surfaces can be defined as a "top surface" and a "bottom surface".

A resin tape, such as polyimide resin, can be used as the substrate 1. An opening 1a, which penetrates from first surface to second surface of the substrate 1. On each of the first and second surfaces, an asperity layer having a height of from about 100 nm to about 10 μm, more suitably in a range of from about 1 μm to about 10 μm is formed (the layers are not shown in FIG. 1.). Accordingly, the first adhesive layer 3 and the second adhesive layer 5 are adhered firmly to the first and second surfaces of the substrate so that the wetting is improved by the layers having asperities.

An adhesive for adhering conductive films of conductive materials such as copper (Cu) films and Aluminum (Al) films, can be used as the first adhesive layer 3 and the second adhesive layer 5. The first adhesive layer 3 and the second adhesive layer 5 can be made from epoxy resin or polyaramid resin. Each of the first adhesive layer 3 and the second adhesive layer 5 on the substrate 1 has a film thickness of from about 5 μm to about 20 μm. Especially, it is suitable that the first adhesive layer 3 can be formed thick, considering the adhesive strength of the substrate 1 or the third adhesive layers 7a and 7b. However, when the first adhesive layer 3 is formed too thick, the semiconductor device will be enlarged. On the other hand, when the first adhesive layer 3 is formed too thin, voids will be generated when mounting the semiconductor chip 9, or the like. Accordingly, it is suitable for the film thickness of the first adhesive layer 3 to be in a range of from about 10 μm to about 15 μm, or 12 μm.

As for a material for the third adhesive layers 7a and 7b, an adhesive which does not peel off due to thermal cycling and does not damage the semiconductor chip may be suitable. For example, the third adhesive layer 7a and 7b may be made from an epoxy resin or a polyaramid resin that is more flexible than the materials of the first adhesive layer 3 or the second adhesive layer.

Figure 12:
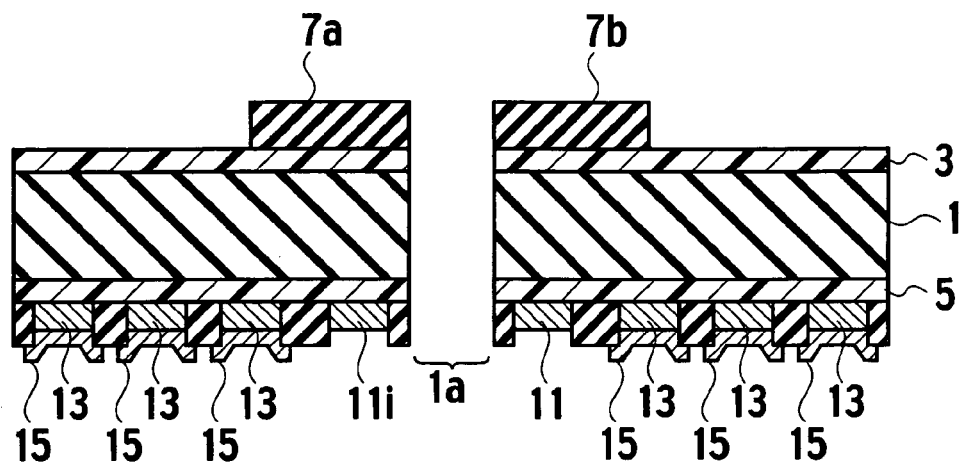
FIG. 12 is a cross-sectional view taken on line XII-XII in FIG. 13, and illustrating the method of assembling the semiconductor device according to the first embodiment of the present invention.
Figure 13:
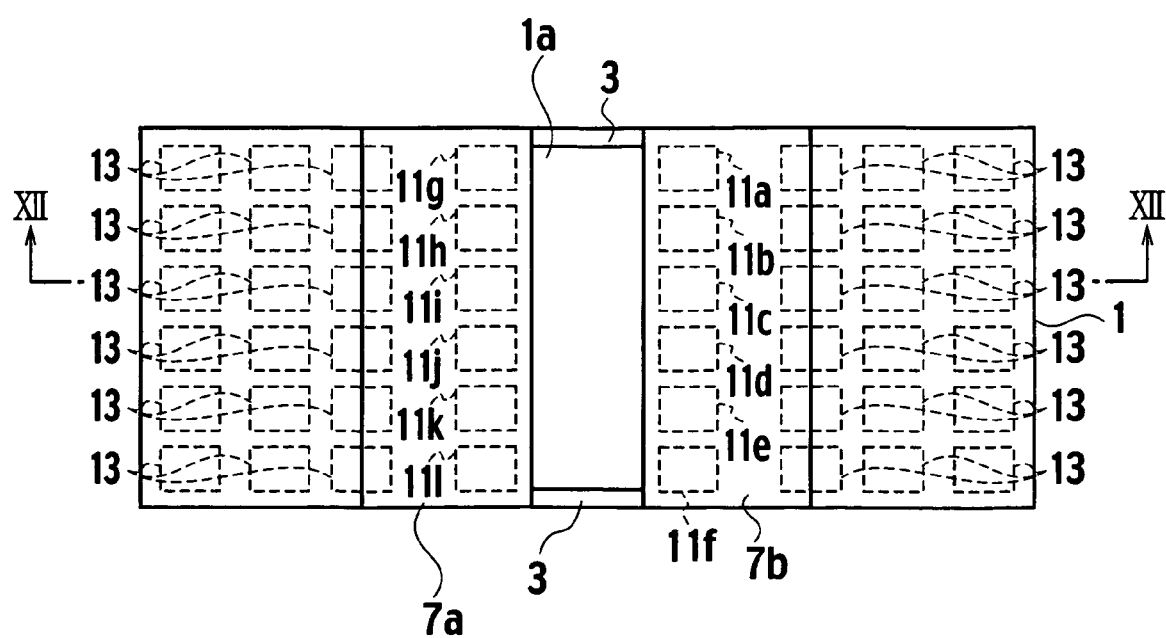
FIG. 13 is a plan view viewed from the first surface of the substrate of the semiconductor device according to the first embodiment of the present invention.

As shown in FIG. 1, the left side end of the third adhesive layer 7a is aligned with the left side end of the semiconductor chip 9. The right side end of the third adhesive layer 7b is aligned with the right side end of the semiconductor chip 9. Each of the third adhesive layers 7a and 7b has a film thickness of from about 25 μm to about 100 μm. The third adhesive layers 7a and 7b opposing each other implement an opening, which provides a space for chip bonding pads 10a, 10b, 10c, . . . , 10f . . . . As shown in FIGS. 12 and 13, as described later, the third adhesive layers 7a and 7b are cut into pieces and provided alongside of two opposing sides of the opening 1a so as to sandwich the opening 1a.

It is suitable that each of the third adhesive layers 7a and 7b are formed thick, considering the adhesive strength between the first adhesive layer 3 and the semiconductor chip 9. However, when the third adhesive layers 7a and 7b are formed too thick, the size of the semiconductor device will be enlarged. On the other hand, when the third adhesion layers 7a and 7b are formed too thin, voids will be generated. Accordingly, it is suitable for the film thickness of the third adhesive layers 7a and 7b to be in a range of from about 20 μm to about 100 μm, suitably in a range of from about 40 μm to about 75 μm, or about 50 μm.

Figure 2:
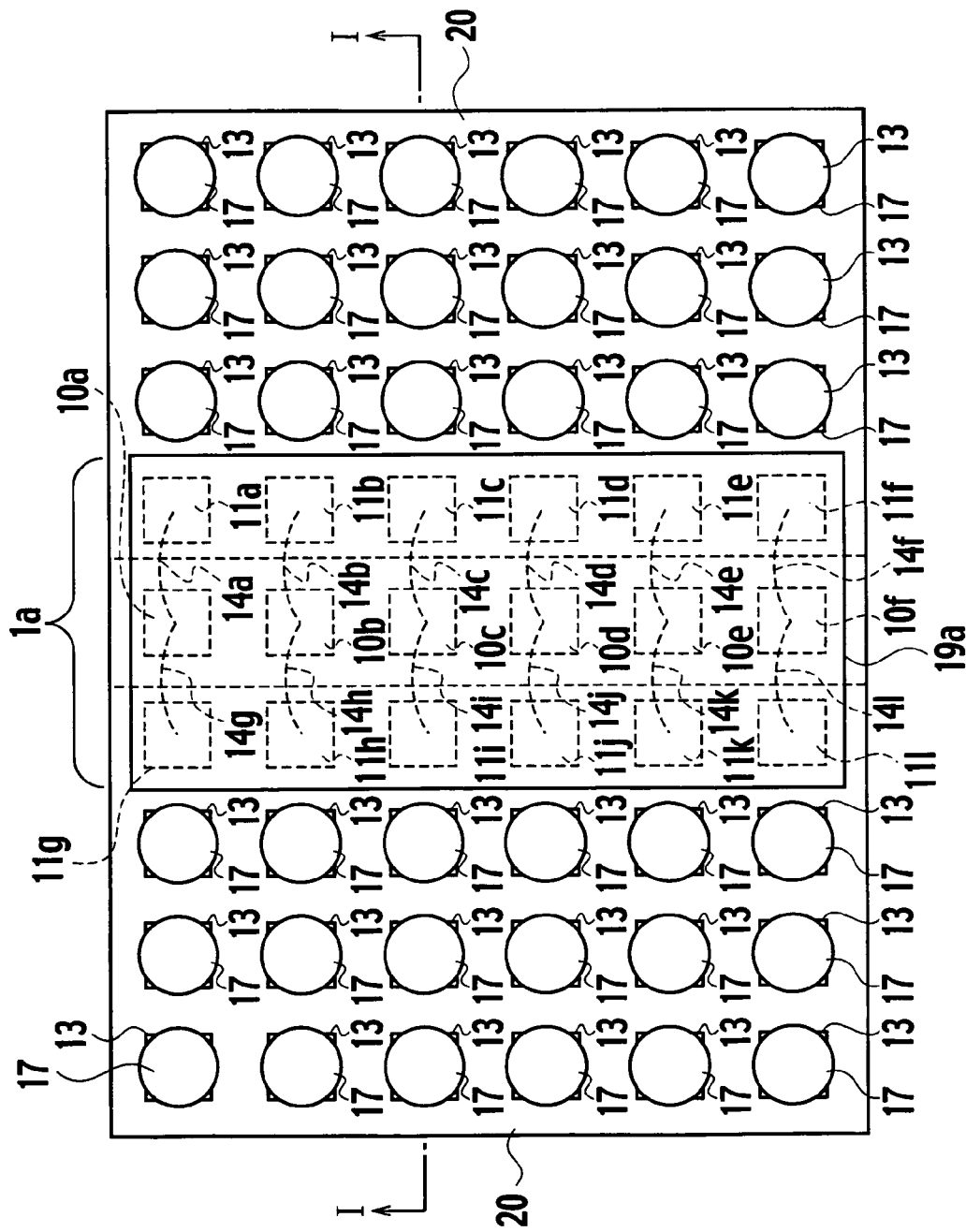
FIG. 2 is a plan view viewed from a second surface of a substrate of the semiconductor device according to the first embodiment of the present invention.

As shown in FIG. 1, the semiconductor chip 9 having an element surface 9a is mounted in a face down configuration on the substrate 1. The element surface 9a lie in a space defined by the opening 1a. As shown in FIG. 2, the chip bonding pads 10a, 10b, 10c, . . . , 10f, . . . are arranged in a central line of the element surface 9a in a line. The chip bonding pads 10a, 10b, 10c, 10d, 10e, and 10f are connected to substrate bonding pads 11a, 11b, 11c, 11d, 11e, and 11f, which are provided on the right side of the second surface, with bonding wires 14a, 14b, 14c, 14d, 14e, and 14f. The chip bonding pads 10a, 10b, 10c, 10d, 10e, and 10f are connected to substrate bonding pads 11g, 11h, 11i, 11j, 11k, and 11l, which are provided on the left side of the second surface, with bonding wires 14g, 14h, 14i, 14j, 14k, and 14l. The bonding wires 14a-14l are made from gold (Au) and the like.

Outer connection pads 13 are provided in an array on a perimeter of the substrate 1, that is, on a residual area of a right side of the opening 1a where the substrate bonding pads 11a-11f are not provided, and on a residual area of the left side of the opening 1a where the substrate bonding pads 11g-11l are not provided. As shown in FIG. 1, a solder resist 20 covers the substrate bonding pads 11a-11l and the outer connection pads 13. Parts of the surfaces of the substrate bonding pads 11a-11l and the outer connection pads 13 are exposed from the solder resist 20. Plating layers 15 made from Nickel (Ni) or Au are plated on the exposed surfaces of the substrate bonding pads 11a-11l and the outer connection pads 13. Outer connection balls 17 are provided on the plating layers 15. As for the outer connection balls 17, lead-free materials can be used in consideration of environmental problems.

The encapsulating resin 19 includes a first encapsulating resin 19a and a second encapsulating resin 19b. The first encapsulating resin 19a is provided in the opening 1a so as to surround the element surface 9a, the chip bonding pads 10a-10f, the substrate bonding pads 11a-11l, and the bonding wires 14a-14l, respectively. The second encapsulating resin 19b is adhered to a top surface of the first adhesive layer 3, a side surface of the third adhesive layers 7a and 7b, and top and side surfaces of the semiconductor chip 9, respectively. Epoxy resin, silicone resin, phenol resin can be used as the second encapsulating resin.

In the semiconductor device according to the first embodiment of the present invention, the first adhesive layer 3, which is made from an adhesive for conductive materials, is inserted between the substrate 1 and the third adhesive layers 7a and 7b so that the substrate 1 and the second encapsulating resin 19b do not contact each other. Although the adhesive strength between the substrate 1 and the second encapsulating resin 19b is weak and easy to peel off, because the semiconductor device as shown in FIG. 1 is constructed such that a direct contact between the substrate 1 and the second encapsulating resin 19b can be avoided, the peeling between the substrate 1 and the second encapsulating resin 19b is prevented.

The third adhesive layers 7a and 7b are not provided on the entire area of the first adhesive layer 3, but the third adhesive layers 7a and 7b are locally provided so as to conform with a shape of the semiconductor chip 9, which is scheduled to be mounted. Although the adhesive strength between the third adhesive layers 7a and 7b and the second encapsulating resin 19b is weak and easy to peel off, in the semiconductor device as shown in FIG. 1, in which a contact area between the third adhesive layers 7a and 7b and the encapsulating resin 19 is reduced to a minimum level, since the contact area is reduced, the peeling between the substrate 1 and the second encapsulating resin 19b can be prevented.

Further, since the first adhesive layer 3 is provided on the asperity layer formed on the first surface of the substrate 1, the adhesive strength between the substrate 1 and the first adhesive layer 3 will be reinforced and peeling will be prevented. Since, the semiconductor device as shown in FIG. 1 is provided with the encapsulating resin 19b, which encapsulates and surrounds the semiconductor chip 9, the planarity of the substrate 1 can be secured when the semiconductor chip 9 is significantly smaller than the entire size of the semiconductor device.

A method of assembling a semiconductor device according to the first embodiment of the present invention is described. The method of assembling a semiconductor device to be described below is an example. Thus, it is needless to say that the present invention can be achieved by use of various other assembling methods including a modified example of the one described below.

A reel tape made from a resin such, as polyimide and the like is prepared as the substrate 1. The substrate 1 is placed in a plasma treatment device. The substrate 1 is exposed to Argon (Ar) gas, at a pressure of 12 Pa, a gas flow rate of 5 ml/min, and at an electric power of 250 W for about 10 seconds. As a result, an asperity layer having a height of from about 100 nm to about 10 μm is formed on the first surface. A similar asperity layer as described above is also formed on the second surface by the plasma treatment.

Figure 3:
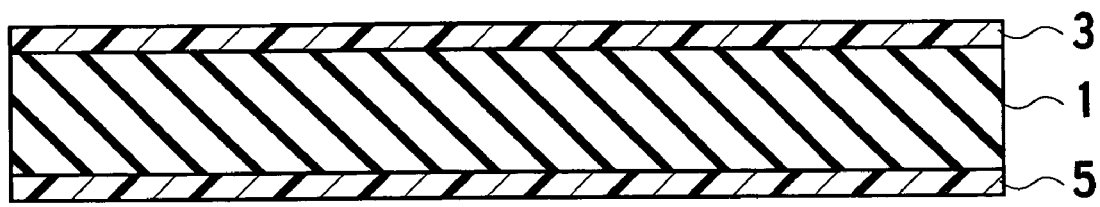
FIGS. 3-9 are schematic diagrams illustrating a method of assembling the semiconductor device according to the first embodiment of the present invention.
Figure 4:
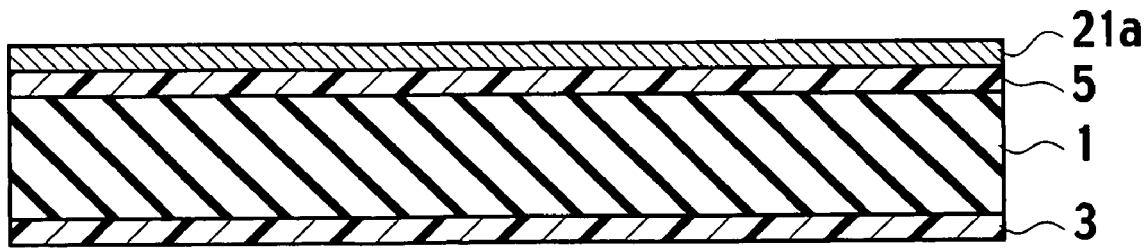
Figure 5:
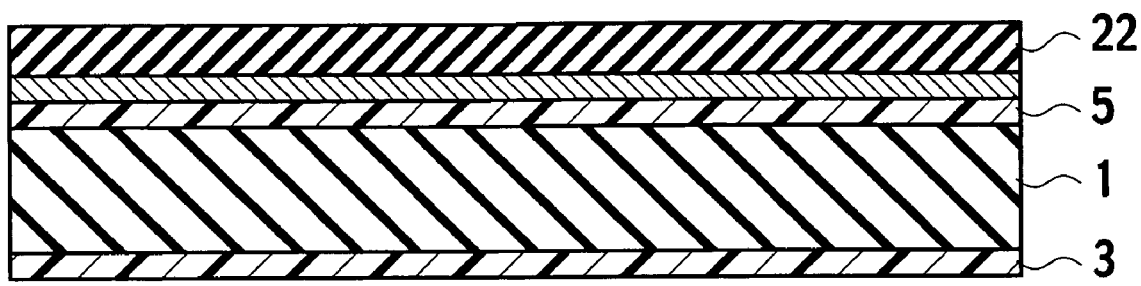

As shown in FIG. 3, the first adhesive layer 3 and the second adhesive layer 5 are formed on the first and second surfaces of the substrate by using a roller or the like. As shown in FIG. 4, a metal film 21a, made from Cu or Al, is provided on the second adhesive layer 5. As shown in FIG. 5, a photoresist film 22 is coated on the metal layer 21a.

Figure 6:
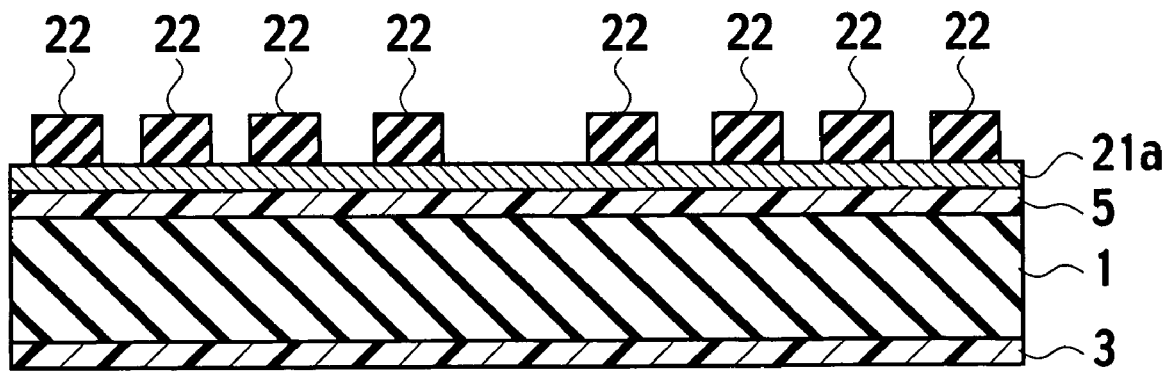
Figure 7:
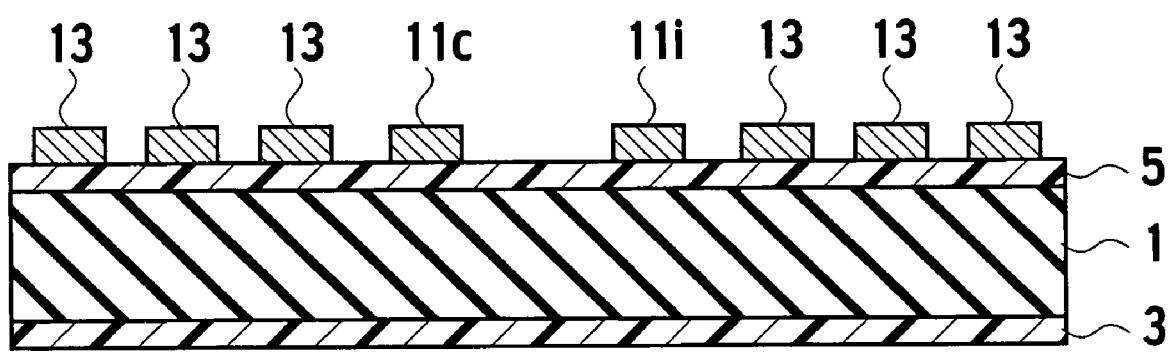

As shown in FIG. 6, the photoresist film 22 is delineated by use of photolithography technology. By use of a delineated photoresist film 22 as an etching mask, a part of the metal film 21a is selectively etched by reactive ion etching (RIE) or the like. By removing the delineated photoresist film 22, such as shown in FIG. 7, the substrate bonding pads 11c, . . . 11i, . . . and the outer connection pads 13 are formed.

Figure 8:
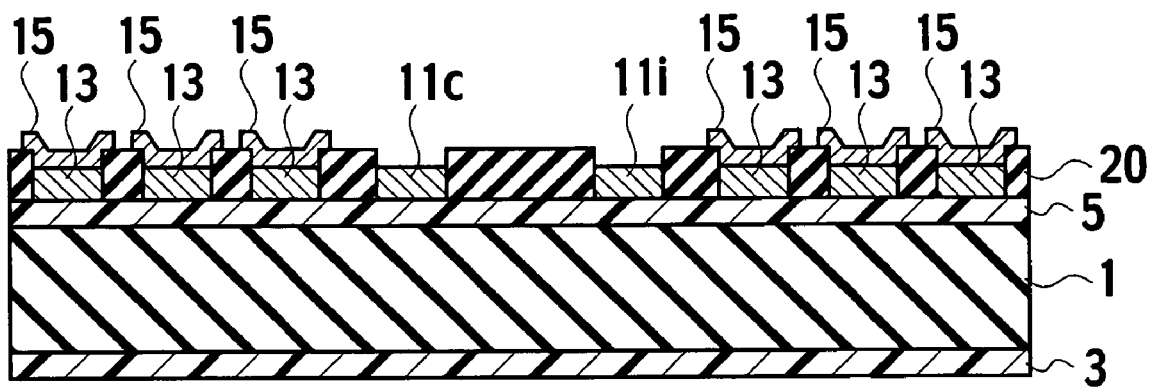
Figure 9:
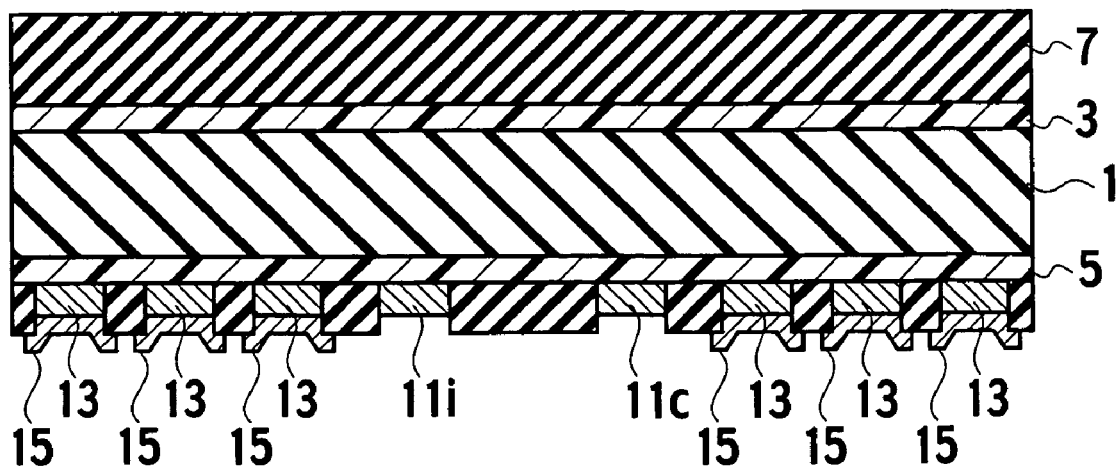

The solder resist 20 having openings is coated on the surfaces of the substrate bonding pads 11c, . . . 11i, . . . and the outer connection pads 13 by screen printing so that the openings 1a accommodate the substrate bonding pads 11c, . . . 11i, . . . and the outer connection pads 13, respectively. As shown in FIG. 8, a plurality of plating layers 15, each of which is made of Ni or Au layer, or the like, are selectively plated onto the outer connection balls 13. As shown in FIG. 9, a layer 7, which is to be the third adhesive layers 7a and 7b is formed on the entire area of the first adhesive layer 3.

Figure 10:
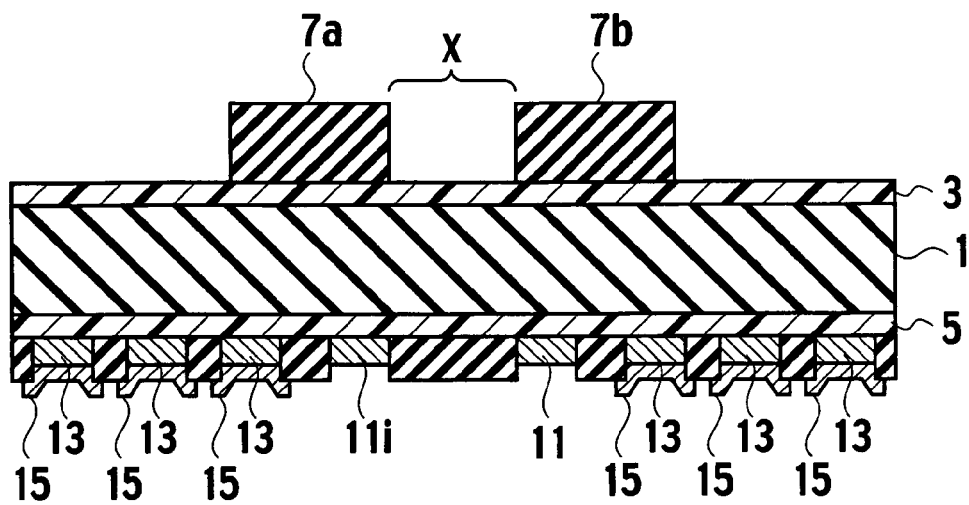
FIG. 10 is a cross-sectional view taken on line X-X in FIG. 11, and illustrating the method of assembling the semiconductor device according to the first embodiment of the present invention.
Figure 11:
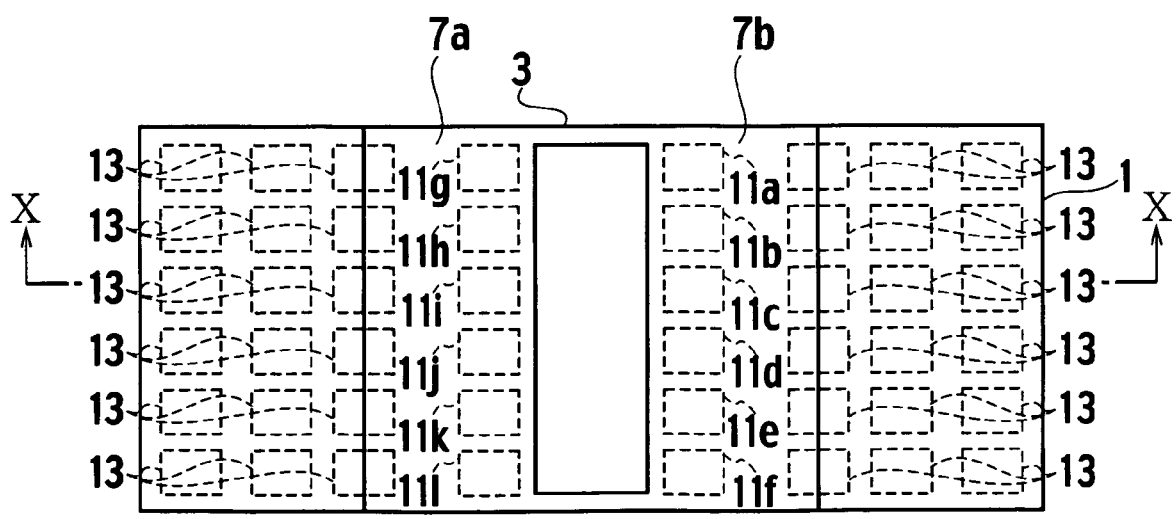
FIG. 11 is a plan view viewed from the first surface of the substrate of the semiconductor device according to the first embodiment of the present invention.

As shown in FIGS. 10 and 11, a part of the layer 7 is punched through. The layer 7 positioned on an area X, which becomes the opening 1a, is selectively removed so as to leave the adhesive layers 7a and 7b on the first adhesive layer 3. As a result, the layers 7a and 7b are provided on opposing sides of an outline of the area X. After that, as shown in FIGS. 12 and 13, the opening 1a, which penetrates through the first and second surfaces, is formed. Alternatively, pieces of the third adhesive layers 7a and 7b can be pre-shaped, and adhered directly to the first adhesive layer 3.

Figure 14:
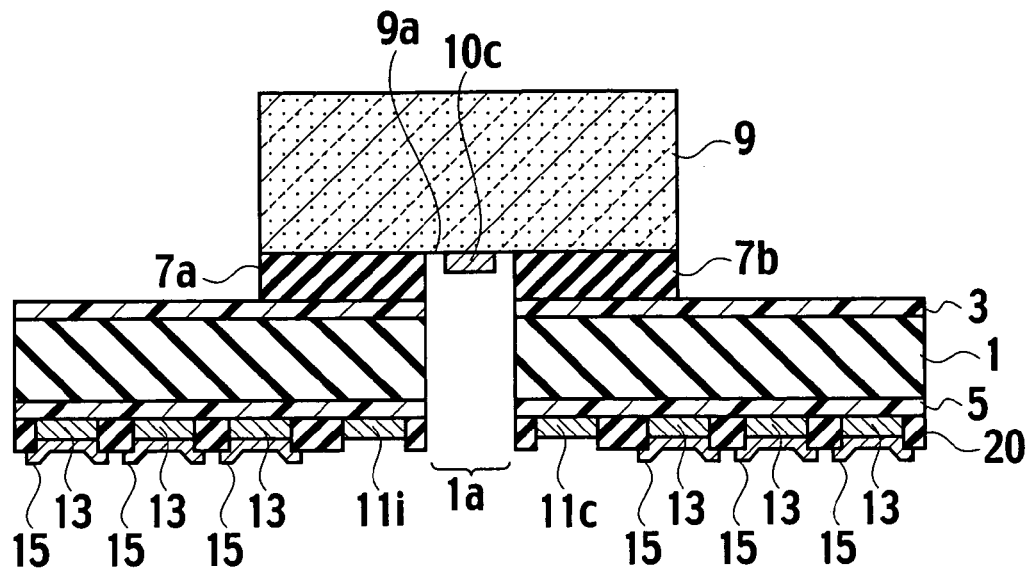
FIGS. 14-18 are cross-sectional views illustrating the method of assembling the semiconductor device according to the first embodiment of the present invention.
Figure 15:
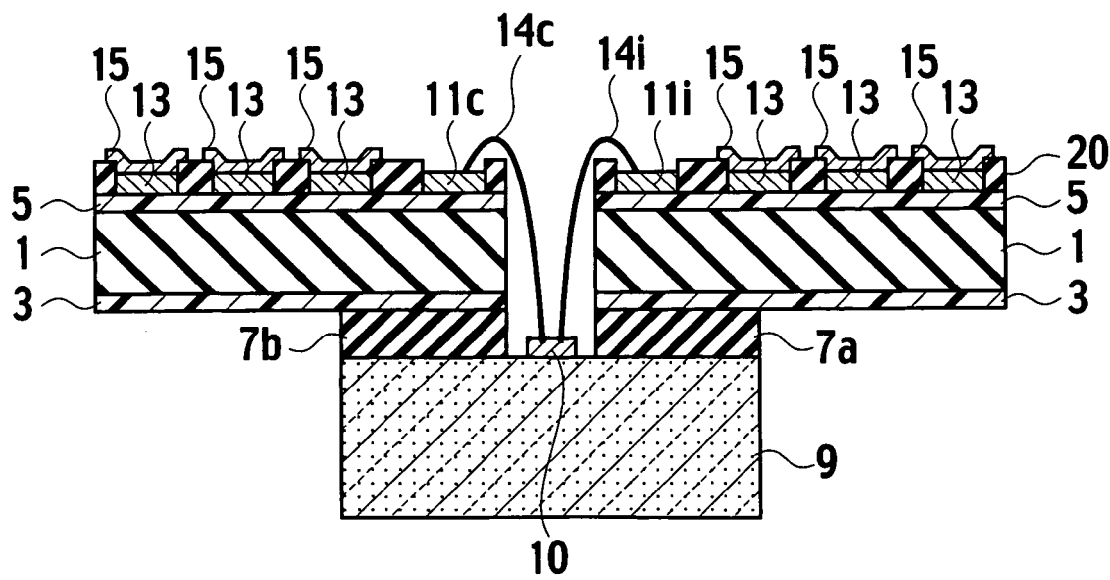

As shown in FIG. 14, the semiconductor chip 9 is adhered to the third adhesive layers 7a and 7b. The chip bonding pads 10c, which are formed on the element surface 9a of the semiconductor device 9, is exposed to the second surface of the substrate 1 where the opening 1a is formed. At this time, the third adhesive layers 7a and 7b can be patterned to be the same size as the outline of the semiconductor chip 9. As shown in FIG. 15, the substrate bonding pads 11c, . . . , 11i, which are formed on the second surface, and the chip bonding pads 10c . . . are electrically connected by thermocompression or ultrasonic bonding, or the like.

Figure 16:
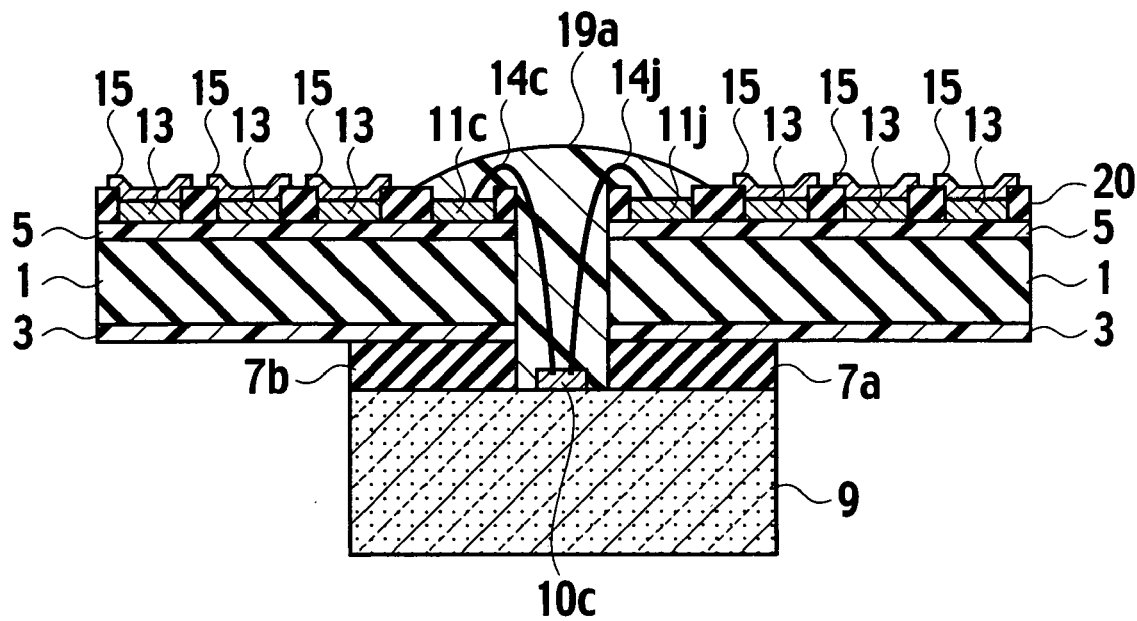
Figure 17:
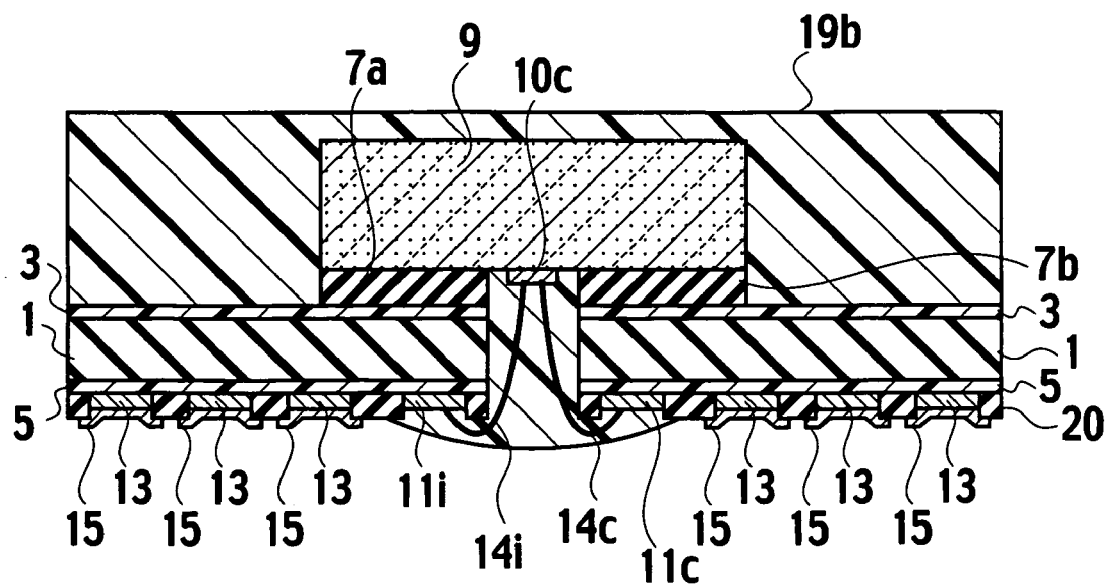
Figure 18:
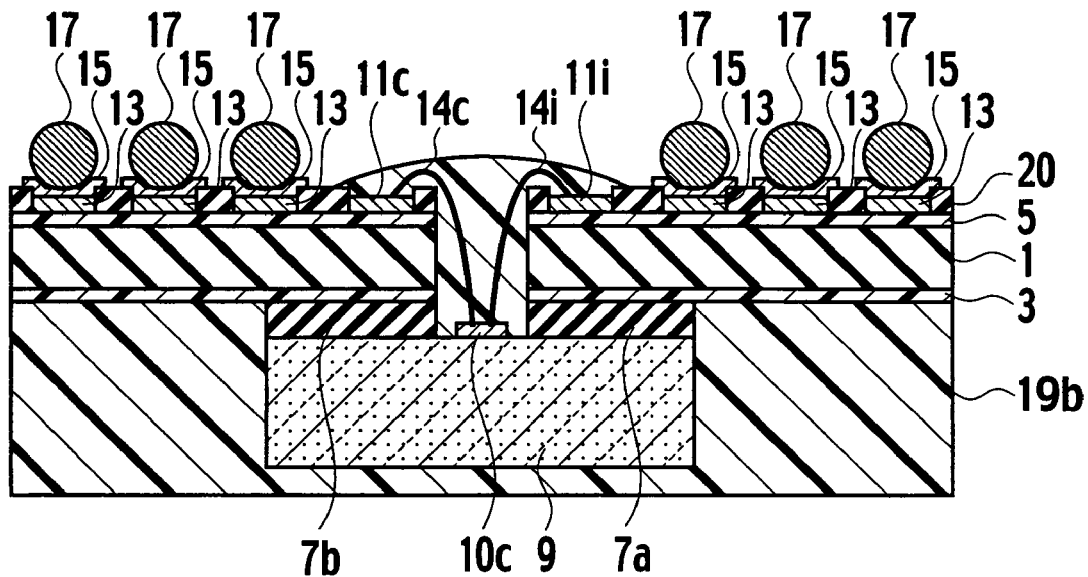

Accordingly, as shown in FIG. 16, an encapsulating resin 19a is provided around the chip bonding pads 10c, . . . and the substrate bonding pads 11c, . . . 11i, . . . by use of a potting device or the like. As shown in FIG. 17, a second encapsulating resin 19b is provided around the semiconductor chip 9 by a molding device or the like. The first and second encapsulating resins 19a and 19b are hardened by or heating, or the like. A flux is applied to the surface of the plating layer 15. As shown in FIG. 18, the outer connection balls 17 are formed on the outer connection pads 13. Then, the semiconductor device as shown in FIG. 1 can be assembled.

In the semiconductor device according to the first embodiment of the present invention, the first surface of the substrate 1 is first exposed to a plasma to form the asperity layer before the first adhesive layer 3 is formed. Since the first adhesive layer 3 is formed on the asperity layer, the adhesive strength between the first adhesive layer 3 and the substrate 1 can be ensured. In addition, the third adhesive layers 7a and 7b are formed to have a shape corresponding to the outline of the semiconductor device 9 to be mounted.

The semiconductor device as shown in FIG. 1 can reduce a contact area between the third adhesive layers 7a and 7b and the second encapsulating resin 19b to a minimum level and can prevent peeling between the substrate 1 and the second encapsulating resin 19b. Further, since the second encapsulating resin 19b is provided around the semiconductor chip 9, the planarity of the substrate 1 can be ensured and a reliability will be improved when the semiconductor chip 9 is significantly smaller than the entire size of the semiconductor device.

Figure 19:
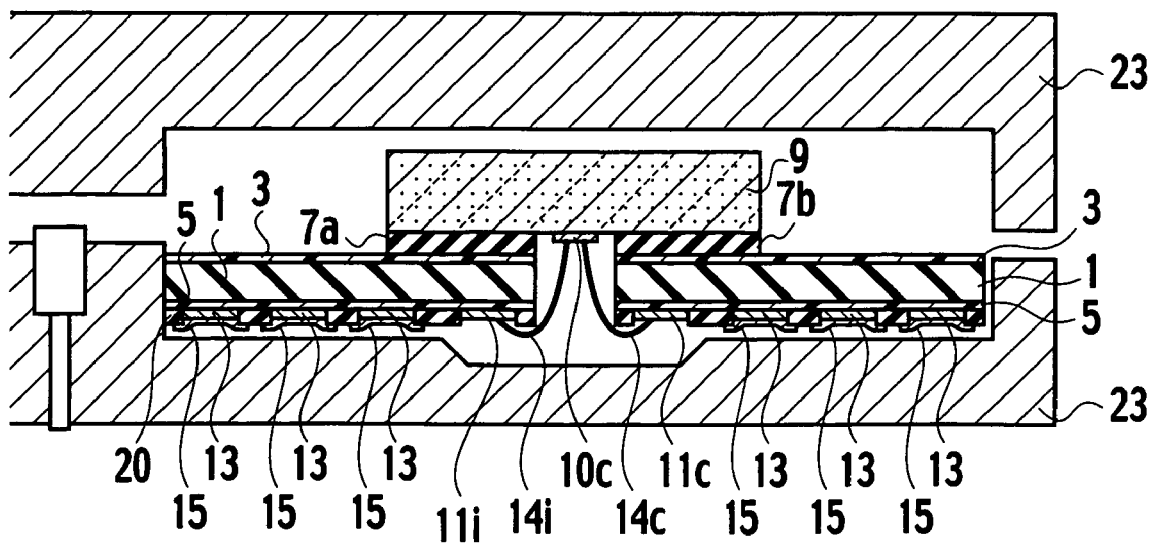
FIGS. 19 and 20 are cross-sectional views illustrating another method of assembling the semiconductor device according to the first embodiment of the present invention.
Figure 20:
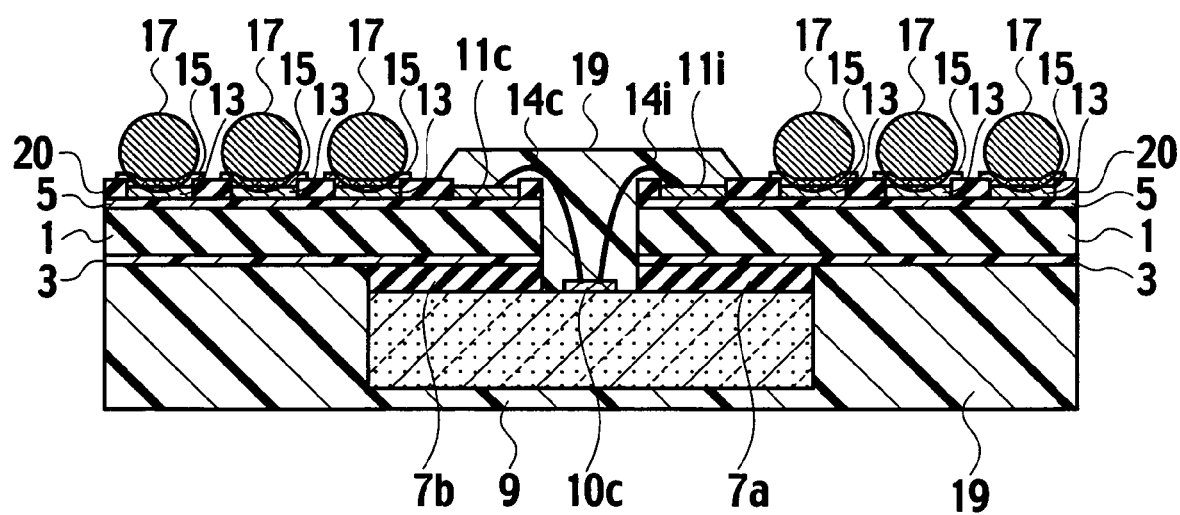

As shown in FIG. 19, when encapsulating the semiconductor chip 9 by the first and second encapsulating resins 19a and 19b, the substrate 1 is inserted into a mold 23 of the molding device and the encapsulating resin 19 is provided around the opening 1a and the semiconductor chip 9 simultaneously. After the encapsulating resin 19 is hardened, as shown in FIG. 20, the outer connection balls 17 are formed on the outer connection pads 13. The semiconductor device as shown in FIG. 1 is completed.

Second Embodiment

Figure 21:
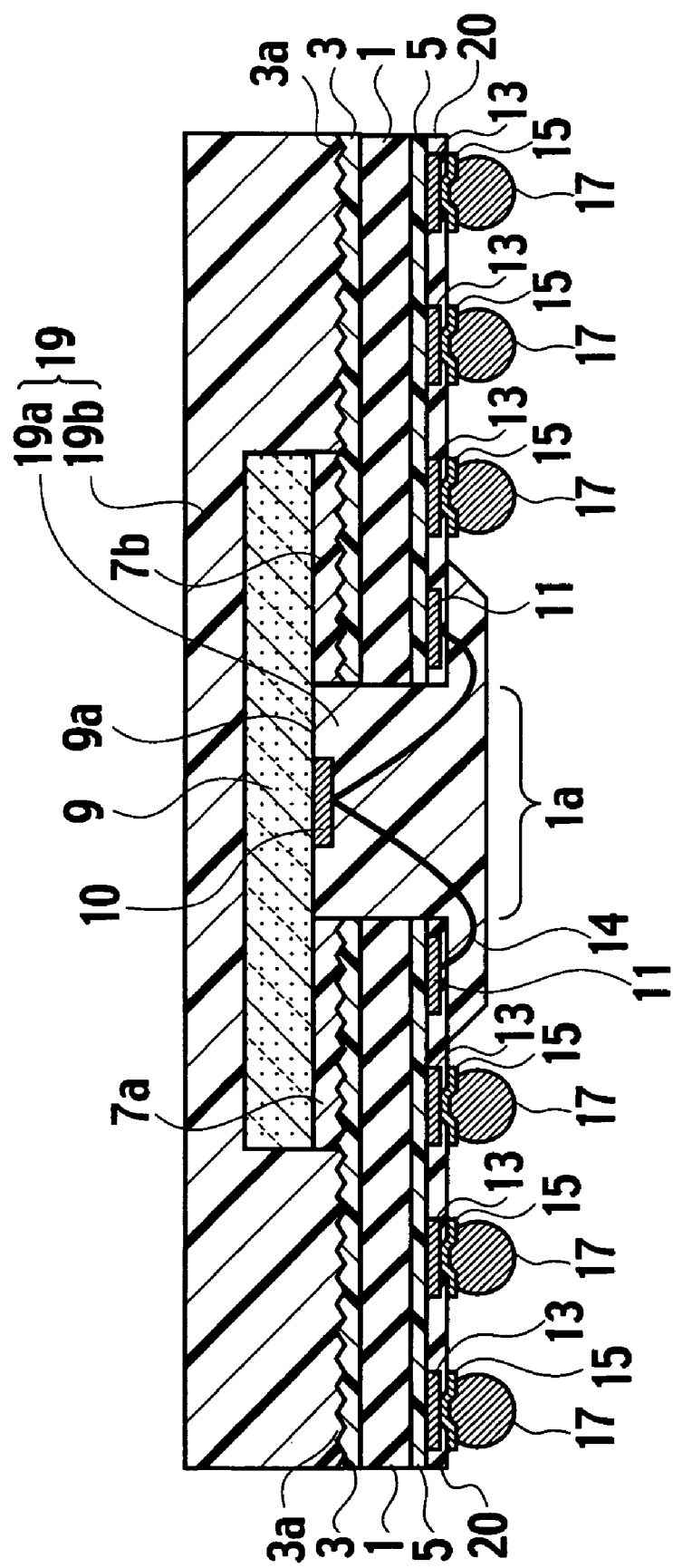
FIG. 21 is a cross-sectional view illustrating a semiconductor device according to a second embodiment of the present invention.

As shown in FIG. 21, a semiconductor device according to a second embodiment of the present invention includes an anchor member 3a formed on a surface of the first adhesive layer 3. The anchor member 3a is in contact to the third adhesive layers 7a and 7b. Here, the "anchor member 3" indicates an asperity layer having a height of from about 0.1 µm to about 5.0 µm. The anchor member 3a is formed by peeling a metal film, which is applied on the surface of the first adhesive layer 3. Since other features are substantially the same as the semiconductor device as shown in FIG. 1, detailed explanations are omitted.

In the semiconductor device as shown in FIG. 21, the anchor member 3a has an asperity and is provided between the first adhesive layer 3 and the third adhesive layers 7a and 7b. The adhesive strength between the first adhesive layer 3 and the third adhesive layers 7a and 7b is improved. Further, since the semiconductor chip 9 is encapsulated by the second encapsulating resin 19b, the planarity of the substrate 1 can be ensured by the encapsulating resin 19 when the semiconductor chip 9 is significantly smaller than the entire size of the semiconductor device. The reliability will also be increased.

A method of assembling a semiconductor device as shown in FIG. 21 is described. The method of assembling a semiconductor device to be described below is an example. Thus, it is needless to say that the present invention can be achieved by use of various other assembling methods including a modified example of the one described below.

A tape made from a resin, such as polyimide and the like is prepared as the substrate 1. The substrate 1 is disposed in a plasma treatment equipment. The substrate 1 is exposed to Argon (Ar) gas, at a pressure of 12 Pa, a gas flow rate of 5 ml/min, an electric power of 250 W for about 10 seconds. As a result, an asperity layer as described in the first embodiment is formed on the first surface of the substrate 1. An asperity formed on the first surface is also formed on the second surface by the plasma treatment.

Figure 22:
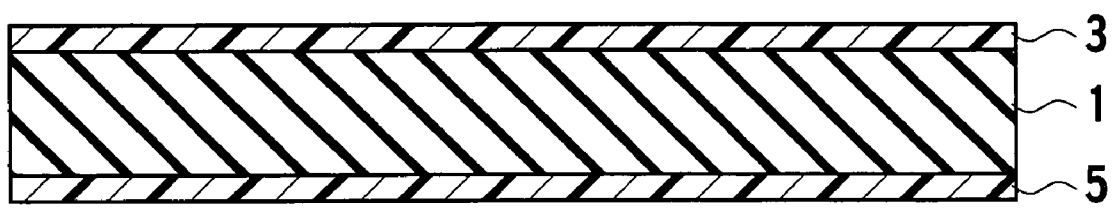
FIGS. 22-35 are cross-sectional views illustrating a method of assembling the semiconductor device according to the second embodiment of the present invention.
Figure 23:
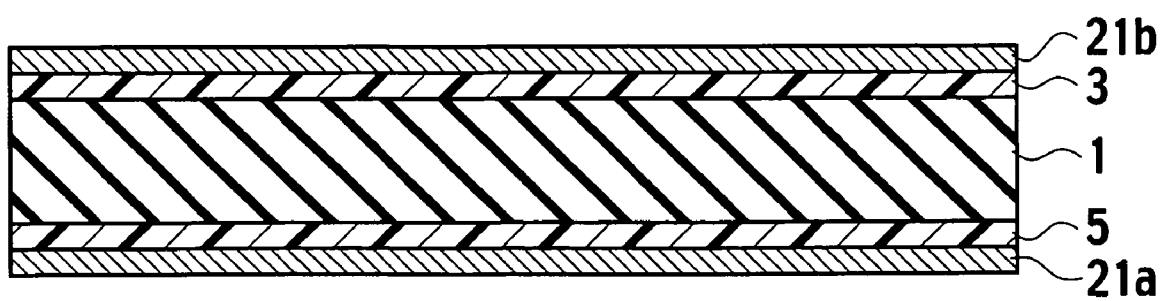
Figure 24:
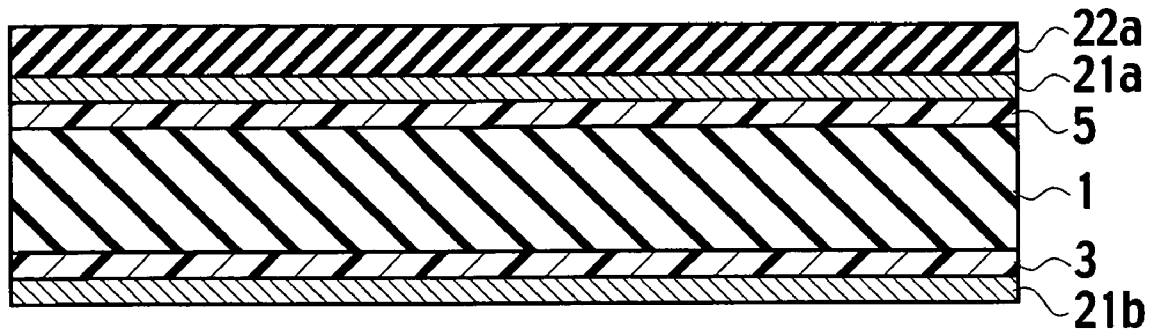

As shown in FIG. 22, the first adhesive layer 3 and the second adhesive layer 5 are formed on the first and second surfaces of the substrate by using a roller or the like. As shown in FIG. 23, a metal film 21b, made from Cu or Al, or the like is provided on the first adhesive layer 3. A metal film 21a, made from Cu or Al, or the like is provided on the second adhesive layer 5. As shown in FIG. 24, a photoresist film 22a is coated on the metal layer 21a.

Figure 25:
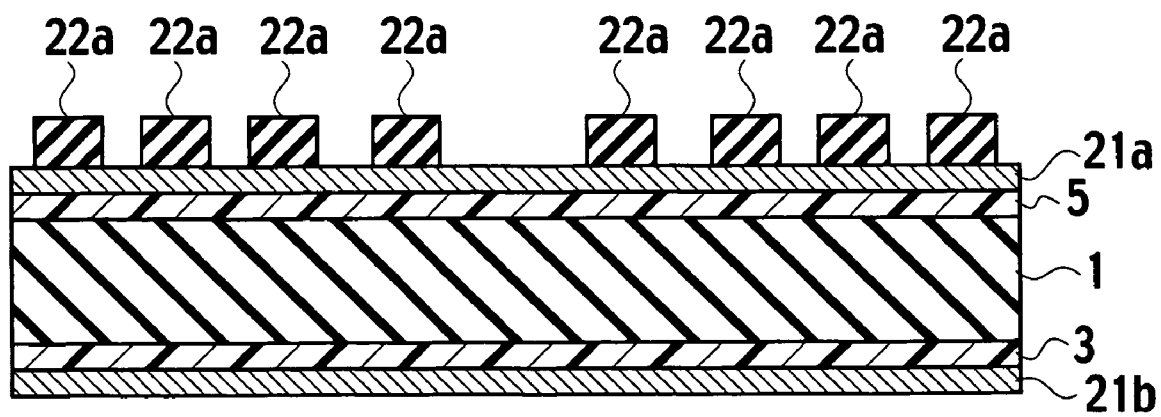
Figure 26:
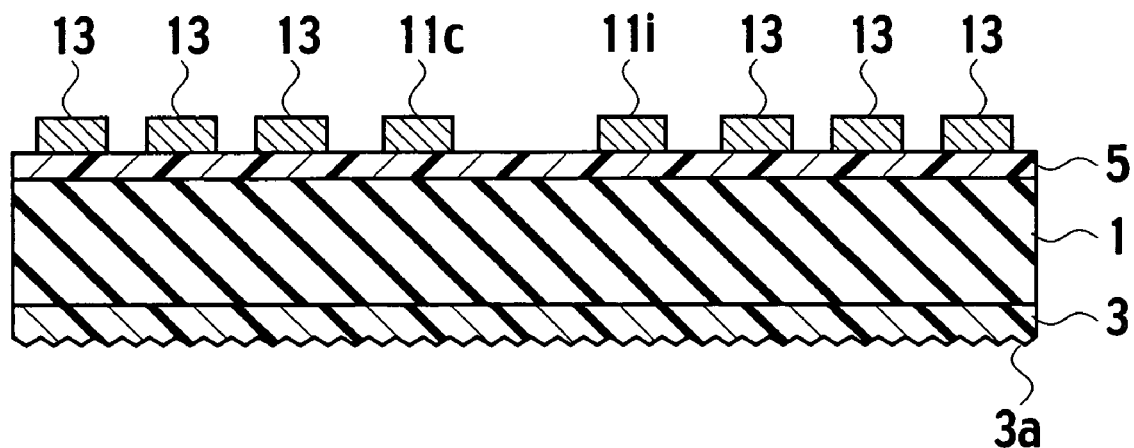

As shown in FIG. 25, the photoresist film 22a is delineated by use of photolithography technology. By use of a delineated photoresist film 22a as an etching mask, a part of the metal film 21a is selectively etched by RIE or the like. All of the metal film 21b is stripped by RIE or the like. As a result, as shown in FIG. 26, the substrate bonding pads 11c, and 11i, and the outer connection pads 13 are formed on the second adhesive layer 5. The anchor member 3a, which has an asperity is formed on the first adhesive layer 3.

Figure 27:
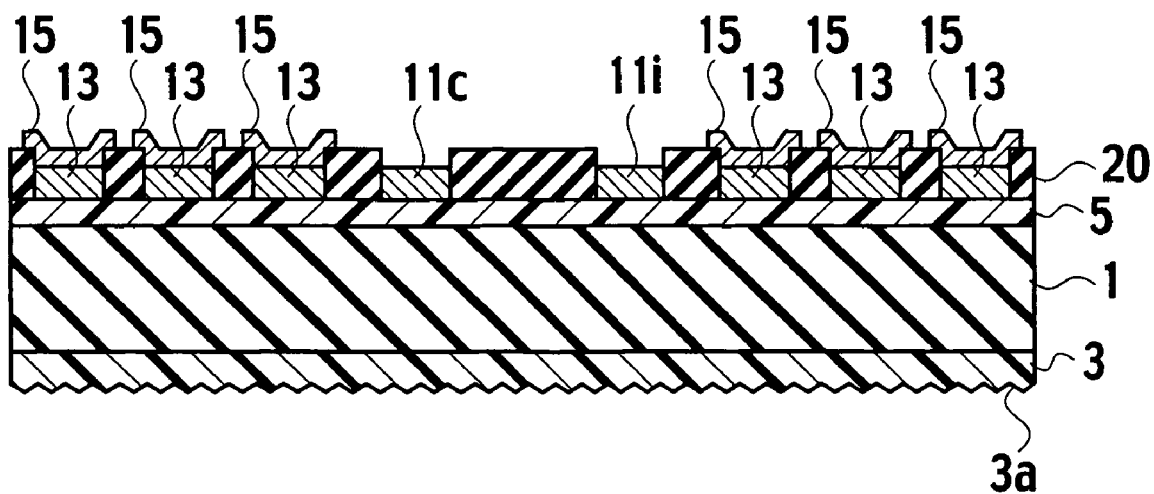
Figure 28:
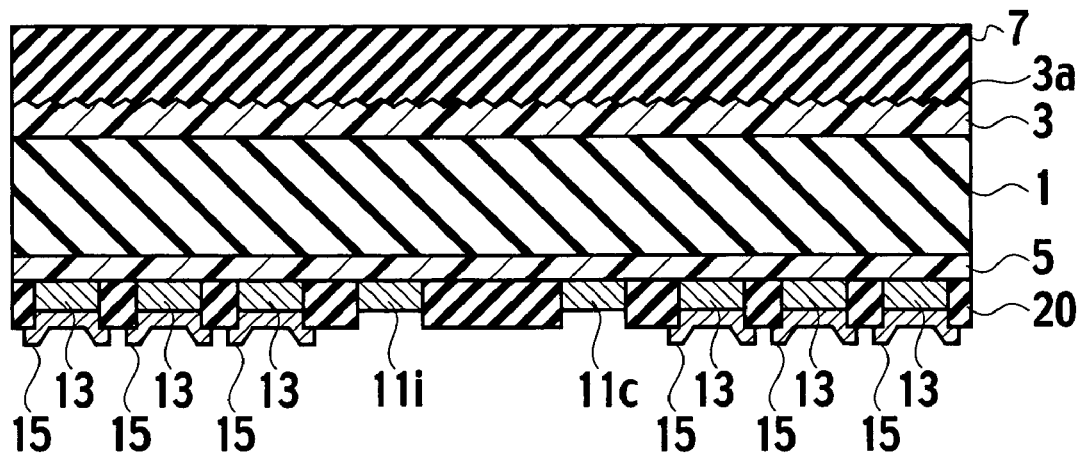

The solder resist 20 having openings is coated on the surfaces of the substrate bonding pads 11c, . . . 11i, . . . and the outer connection pads 13, by screen printing so that the openings 1a accommodate the substrate bonding pads 11c, . . . 11i, . . . and the outer connection pads 13, respectively. As shown in FIG. 27, a plurality of plating layers 15, each of which is made of Ni or Au layer, or the like, are selectively plated onto the outer connection balls 13. As shown in FIG. 28, a layer 7 to be the third adhesive layers 7a and 7b is formed on the entire area of the first adhesive layer 3 having the anchor member 3a on the surface.

Figure 29:
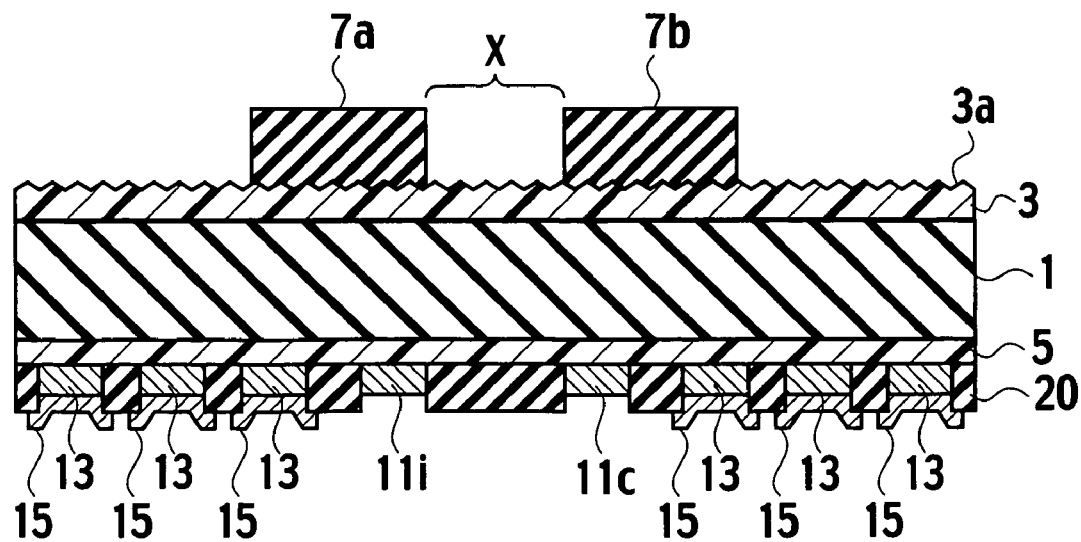
Figure 30:
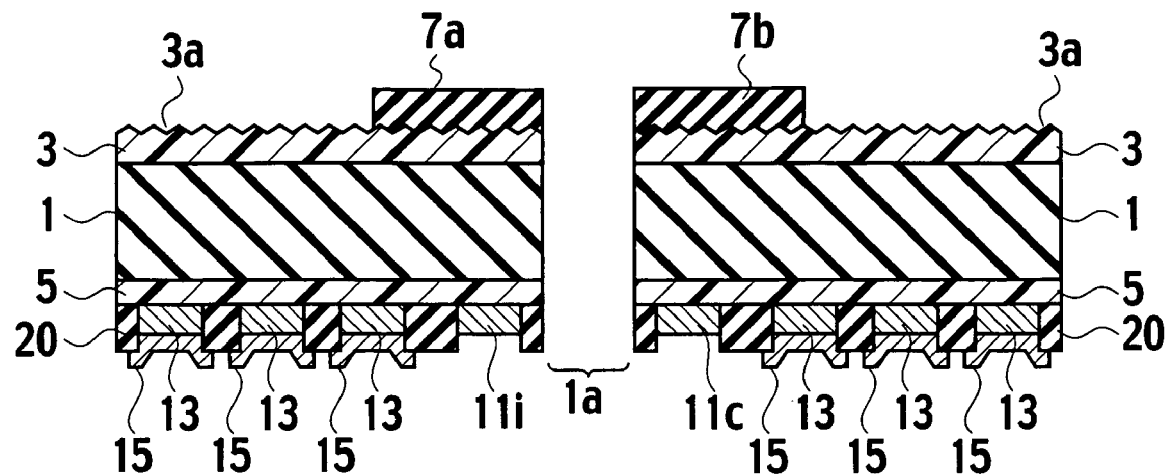

As shown in FIG. 29, a part of the layer 7 is punched through or otherwise removed. The layer 7 positioned on an area X, which becomes the opening 1a, is selectively removed so as to leave the adhesive layers 7a and 7b on the first adhesive layer 3. As a result, the layers 7a and 7b are provided on opposing sides of an outline of the area X. After that, as shown in FIG. 30, the opening 1a, which penetrates through the first and second surfaces, is formed. Alternatively, pieces of the third adhesive layers 7a and 7b can be pre-shaped, and adhered directly to the first adhesive layer 3.

Figure 31:
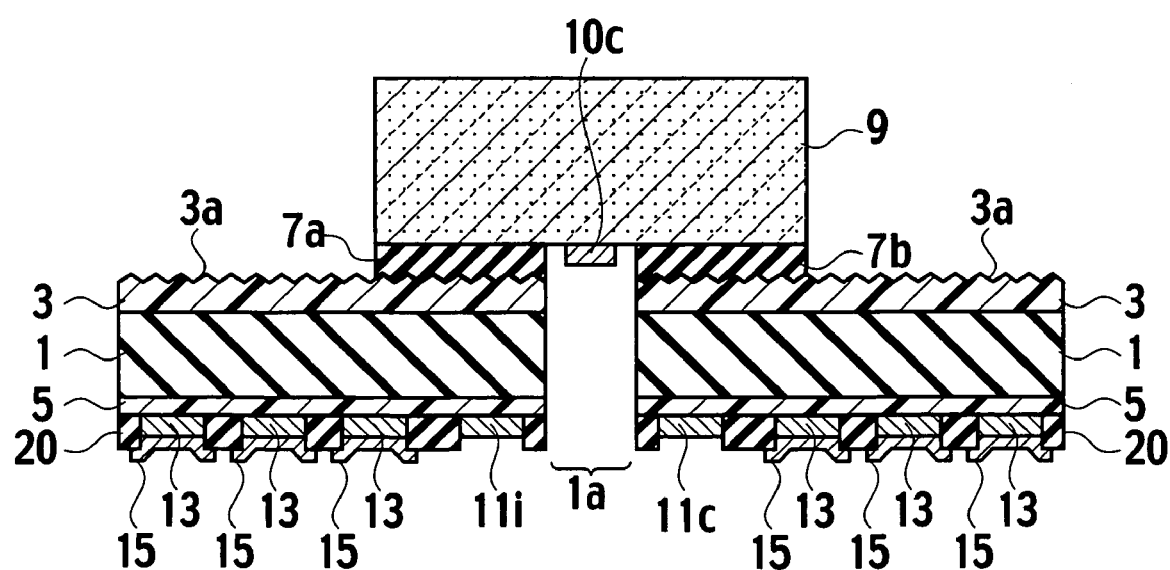
Figure 32:
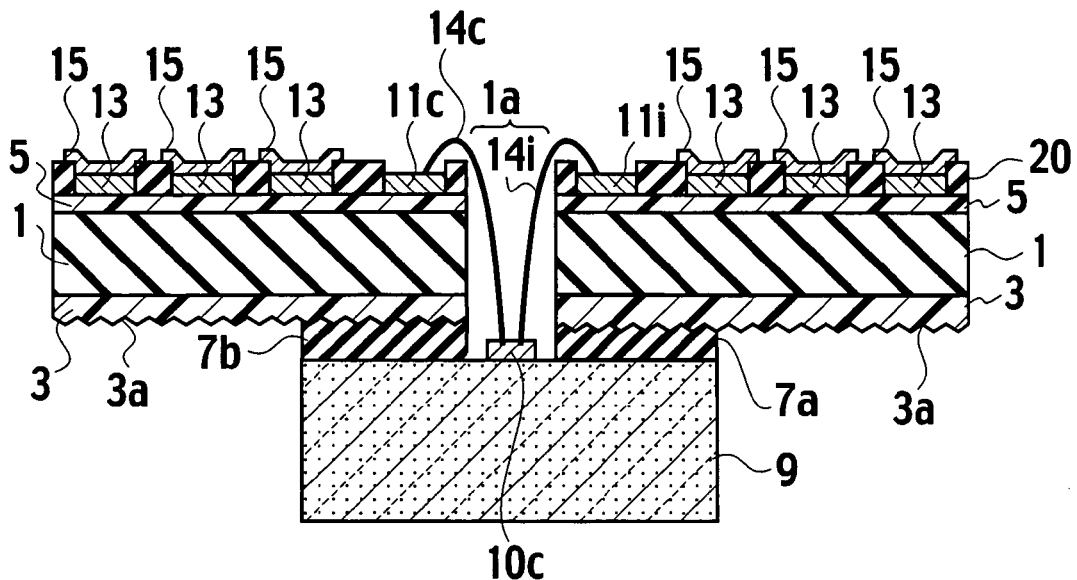

As shown in FIG. 31, a perimeter of the element surface 9a the semiconductor chip 9 is adhered to the third adhesive layers 7a and 7b so that a part of the element surface 9a is exposed to the second surface where the opening 1a is formed. The third adhesive layers 7a and 7b can be patterned to be the same size as the outline of the semiconductor chip 9. As shown in FIG. 32, the substrate bonding pads 11c, . . . , 11i, which are formed on the second surface, and the chip bonding pads 10c . . . are electrically connected by thermo-compression or the ultrasonic bonding, or the like.

Figure 33:
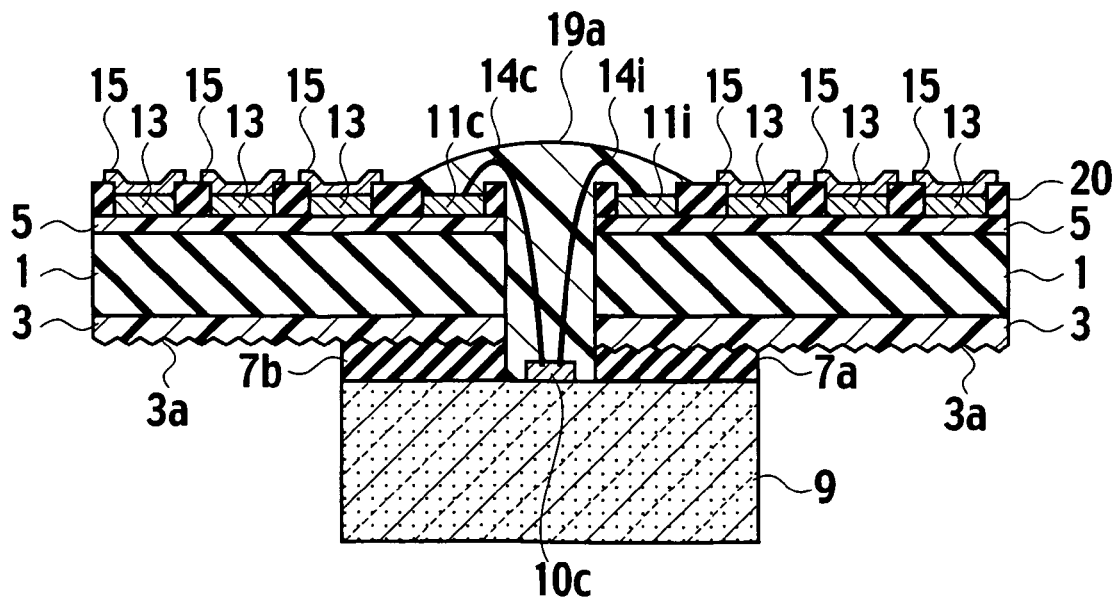
Figure 34:
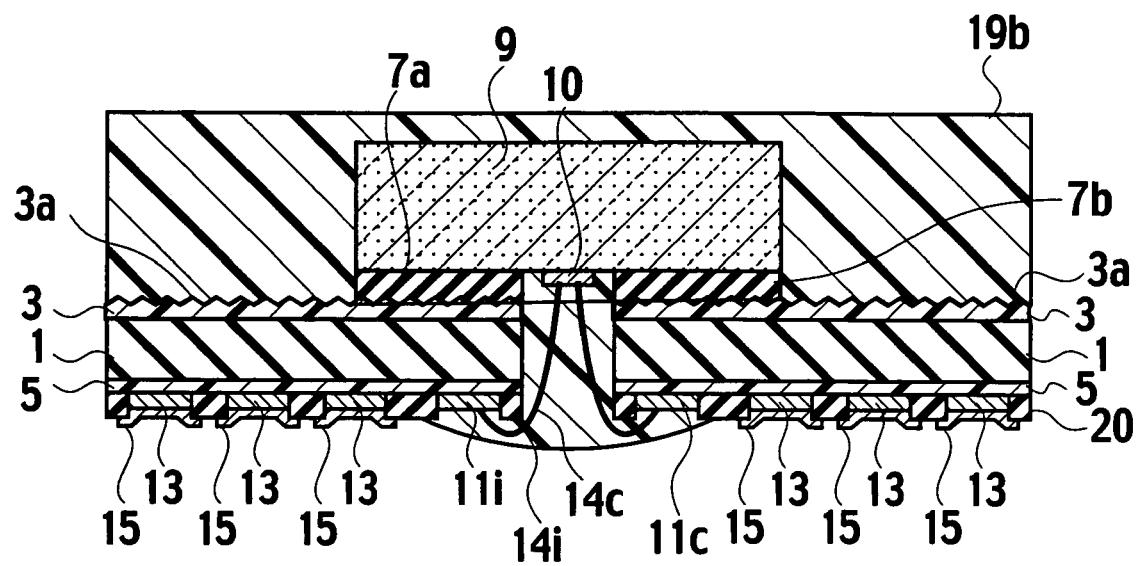
Figure 35:
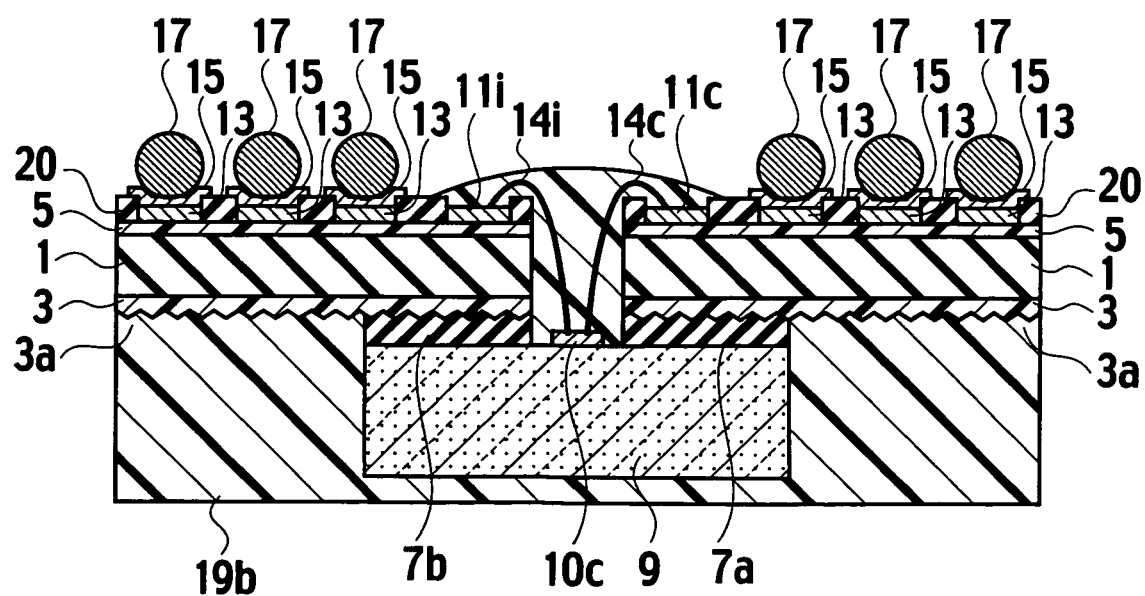

As shown in FIG. 33, the encapsulating resin 19a is provided around the chip bonding pads 10c, . . . and the bonding wires 14c, . . . 14i, . . . by use of a potting device or the like. As shown in FIG. 34, the second encapsulating resin 19b is provided around the semiconductor chip 9 by a molding device, or the like. The first and second encapsulating resins 19a and 19b are hardened by heating, or the like. A flux is applied to the surface of the plating layer 15. As shown in FIG. 35, the outer connection balls 17 are formed on the outer connection pads 13.

In the mounting method of the semiconductor device as shown in FIG. 21, the asperity layer is first formed on the first surface of the substrate 1 by the plasma treatment and the first adhesive layer 3 is formed on the layer. Therefore, the adhesion strength between the substrate 1 and the first adhesive layer 3 will be increased. Further, the metal film 21b is formed on the surface in contact to the third adhesive layers 7a and 7b of the first adhesive layer 3. Since the anchor member 3a, which has an asperity is formed on the surface of the first adhesive layer 3 by peeling off the metal film 21b, a wet property of the surface of the first adhesive layer 3 will be increased. Further, the adhesion strength between the first adhesive layer 3 and the second encapsulating resin 19b will be increased and the reliability will also be increased.

In addition, the third adhesive layers 7a and 7b are formed to have a shape corresponding to the outline of the semiconductor device 9. The semiconductor device as shown in FIG. 21 can reduce a contact area between the third adhesive layers 7a and 7b and the second encapsulating resin 19b to a minimum level and can prevent peeling between the substrate 1 and the second encapsulating resin 19b. Further, since the second encapsulating resin 19b is provided around the semiconductor chip 9, the planarity of the substrate 1 can be ensured and reliability will be improved when the semiconductor chip 9 is significantly smaller than the entire size of the semiconductor device.

(Evaluation of the Adhesive Strength)

Figure 36:
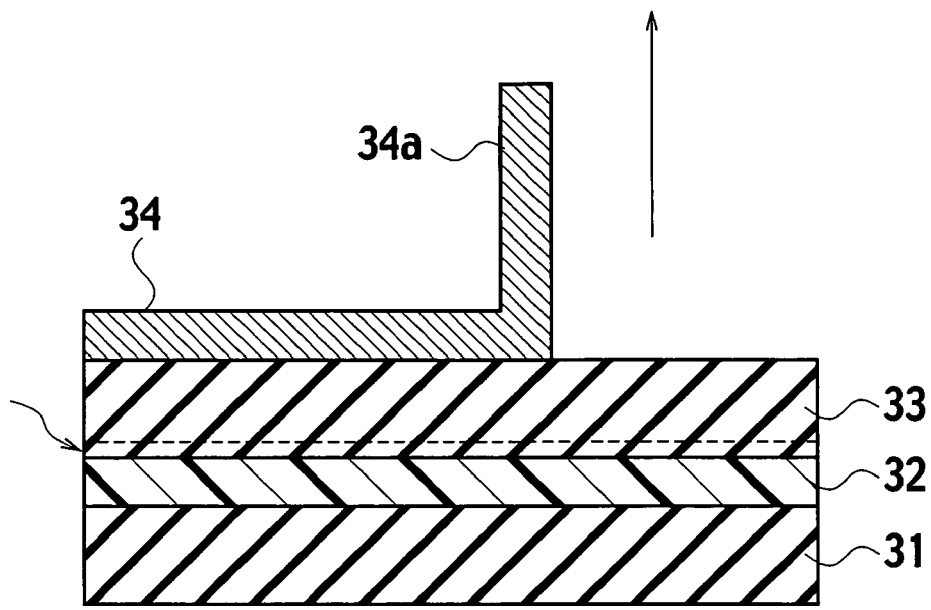
FIG. 36 is a schematic diagram illustrating a peel test for evaluating adhesion strength of the semiconductor device according to the first and second embodiments of the present invention.
Figure 37:
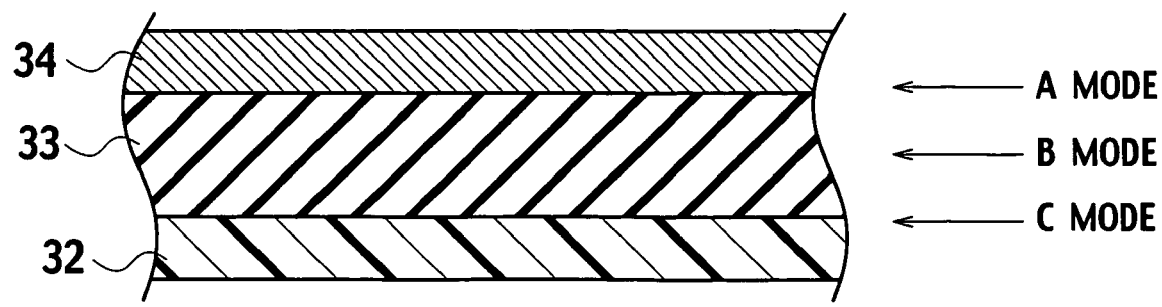
FIG. 37 is a schematic diagram illustrating peeling conditions (failure characteristics) of a substrate to be tested for the peel test as shown in FIG. 36.

A peel test is given to evaluate the adhesion strength of the semiconductor device as shown in FIGS. 1 and 21. Concretely, as shown in FIG. 36, a glass epoxy substrate 31, which is a base substrate for using the peel test, is prepared. An adhesive 32 for adhering a semiconductor chip is adhered onto the glass epoxy substrate 31. The adhesive 32 is made from the same material as the third adhesive layers 7a and 7b, such as epoxy resin or the silicon resin, or the like. A surface for measuring adhesion strength (a measurement surface) of a measurement substrate 33 is adhered to the adhesive 32. A copper film 34 having a folding member 34a is placed to another surface (a no measurement surface) of the measurement substrate 33. The folding member 34a is folded perpendicular to the measurement substrate 33. The adhesion strength is evaluated by pulling at the folding member 34a perpendicularly.

Figure 38:
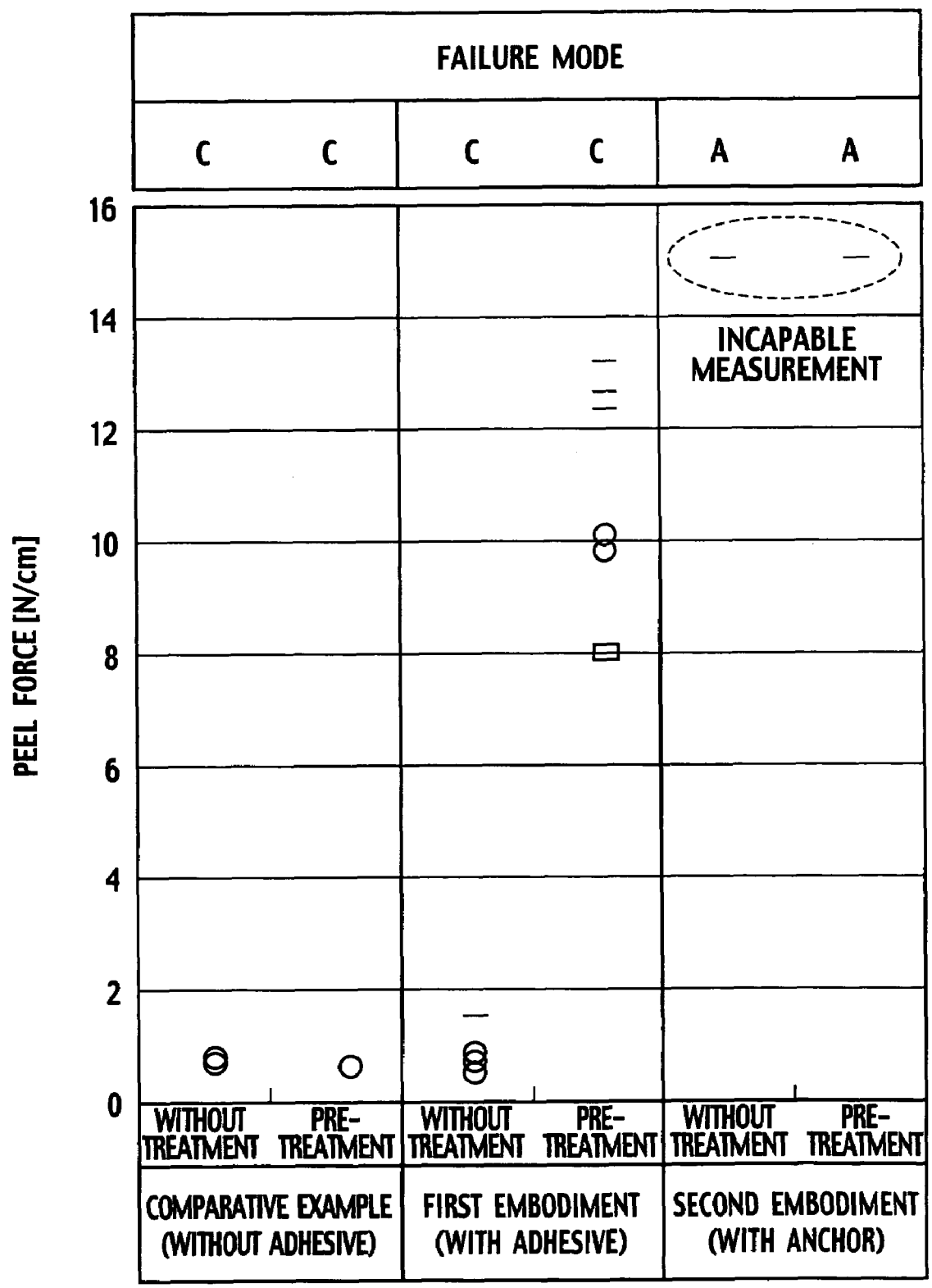
FIG. 38 is a graph illustrating a test result of the peel test as shown in FIG. 36.

Peeling characteristics (failure modes) of the peel test are shown in FIG. 38. Peeling at an interface between the copper film 34 and the measurement substrate 33 is called "A mode". Peeling at the measurement substrate 33 is called "B mode". Peeling at an interface between the measurement substrate 33 and the adhesive 32 is called "C mode".

The resin tape made from polyimide resin as described in the above embodiments is used for the measurement substrate 33. In a "first embodiment (with adhesive)" as shown in FIG. 38, an adhesive for copper films, which is made from the same material and has the same film thickness as the first adhesive layer 3 as shown in FIG. 1, is used for the adhesive 32. The measurement surface of the measurement substrate 33 is adhered to the adhesive 32, and the peel test as shown in FIG. 36 is given. In a "second embodiment (with anchor)", an asperity layer, which is made from the same material and has the same film thickness as the anchor member 3a as shown in FIG. 21, is formed on the measurement surface of the measurement substrate 33, and the peel test as shown in FIG. 36 is given. In a "comparative example (without adhesive)", the first adhesive layer 3a as shown in FIGS. 1 and 21 is not provided and the measurement substrate 32. In FIG. 38, "without treatment" refers to a result of a substrate with no pretreatment. "Pretreatment" refers to a result of a substrate exposed to the Ar plasma in a pretreatment process.

In the "comparative example" as shown in FIG. 38, since the substrate does not have the first adhesive layer 3 in the measurement surface of the measurement substrate 33, a result of the peel force shows insufficient adhesion strength of about 0.7 to about 0.6 N/cm. And the failure mode of the comparative example shows "C mode". Peeling at the interface between the adhesive 32 for adhering a semiconductor chip and the measurement substrate 33 occurs.

On the other hand, in the "first embodiment", since the substrate is pretreated so as to have an asperity on the first surface and the first adhesive layer 3 is provided on the asperity, a result of the peel force is higher than the comparative example of about 7.9 to about 13.4 N/cm. In the "second embodiment", since the anchor member 3 is formed on a surface of the first adhesive layer 3, a result of the peel force shows over 16 N/cm (incapable measurement). In the semiconductor device in the second embodiment, strong adhesion strength is obtained regardless of the presence of the pretreatment. The failure mode of the comparative example shows "A mode". In the second embodiment, peeling at the interface between the adhesive 32 for adhering a semiconductor chip and the measurement substrate 33 does not occur and adhesion strength is significantly increased in comparison with the comparative example.

As described in the above results, it can be understood that the first adhesive layer 3 on the first surface of the substrate and the anchor member 3 can increase the adhesion strength between the encapsulating resin 19 and the third adhesive layers 7a and 7b of the semiconductor device, which has a semiconductor chip significantly smaller than the entire size of the substrate 1.

Other Embodiments

Various modifications will become possible for those skilled in the art after receiving the teachings of the present disclosure without departing from the scope thereof.

Figure 39:
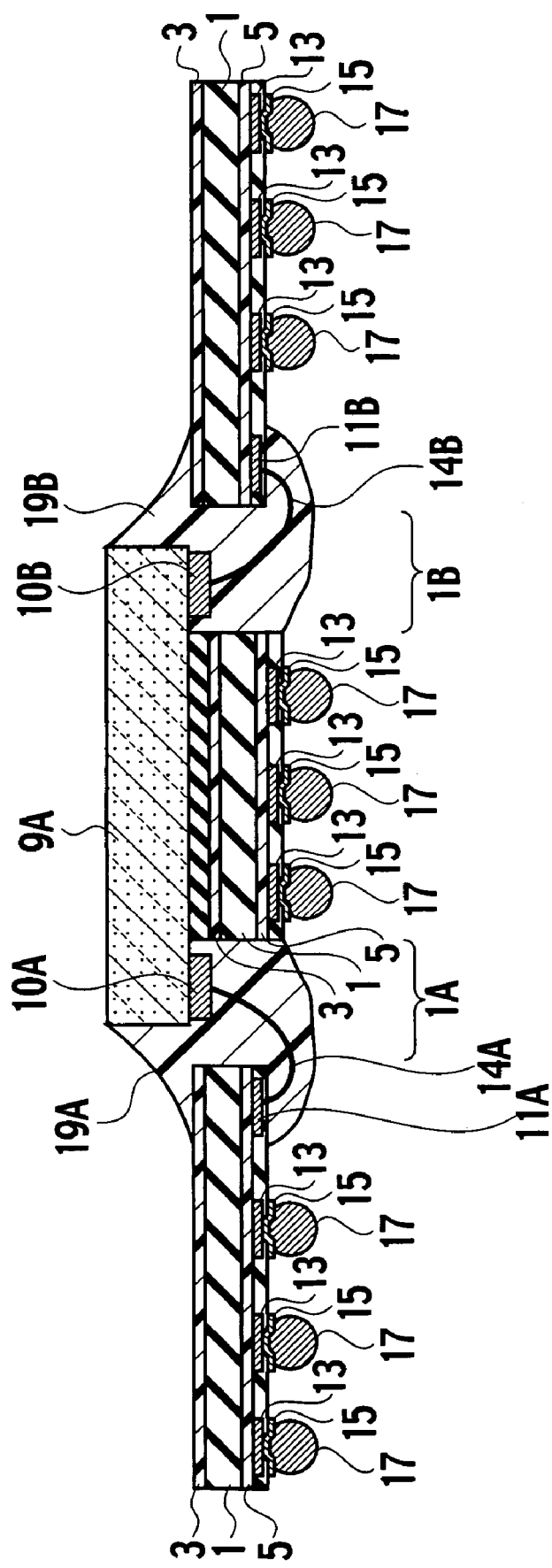
FIG. 39 is a cross-sectional view taken on line XXXVIII-XXXVIII in FIG. 40, and illustrating a method of mounting a semiconductor device according to other embodiment of the present invention.
Figure 40:
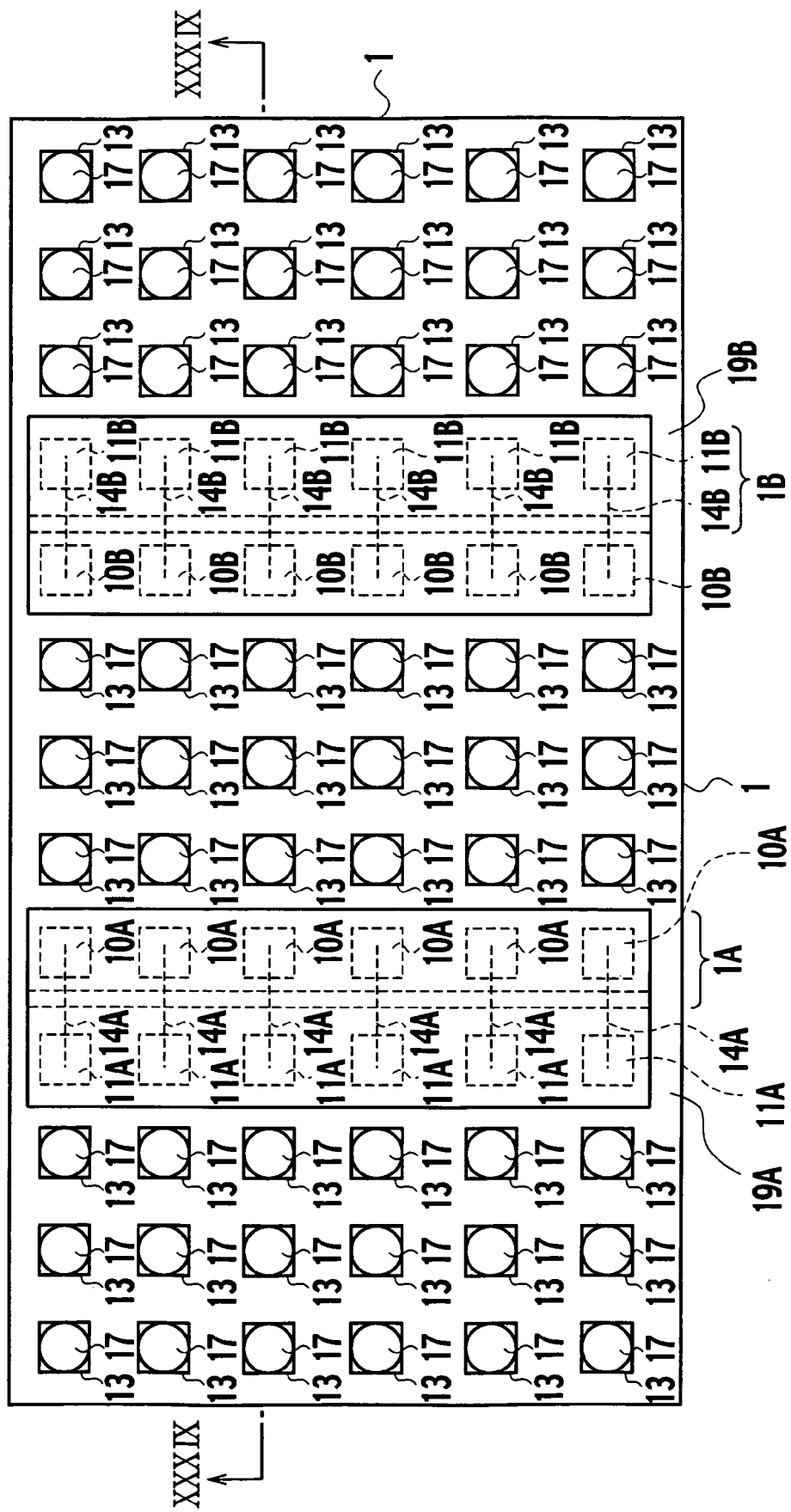
FIG. 40 is a plan view viewed from a second surface of a substrate of the semiconductor device according to the other embodiment of the present invention.

The chip bonding pads 10c, ... as shown in FIG. 1 do not necessarily be arranged at the center of the semiconductor chip. The chip bonding pads 10c, ... can be arranged at a perimeter of the semiconductor chip. As shown in FIGS. 39 and 40, when the semiconductor chip 9A has chip bonding pads 10A and 10B on a perimeter, openings 1A and 1B are formed in the substrate 1. The semiconductor chip 9 is placed on the substrate 1 so that the chip bonding pads 10A and 10B are exposed to the second surface of the substrate 1. The chip bonding pads 10A and 10B are connected to the substrate bonding pads 11A and 11B with the bonding wires 14A and 14B. Encapsulating resins 19A and 19B can be provided around the chip bonding pads 10A and 10B. In addition, the third adhesive layers 3a and 3b as shown in FIGS. 1 and 21, may be shaped to one adhesive layer and provided so as to surround the entire surroundings of the opening 1a.

What is claimed is:

1. A semiconductor device comprising:
   a substrate having a first surface and a second surface opposite to the first surface, the substrate having an opening penetrating from the first surface to the second surface;
   a first adhesive layer provided on the first surface;
   a second adhesive layer provided under the second surface;
   a third adhesive layer provided around the opening and adhered on the first adhesive layer;
   a semiconductor chip arranging a plurality of chip bonding pads in a central portion of the semiconductor chip, a perimeter of the semiconductor chip surrounding the central portion is adhered on the third adhesive layer so as to expose the chip bonding pads through the opening;
   a plurality of substrate bonding pads adhered under the second adhesive layer;
   a plurality of bonding wires connecting the chip bonding pads to the substrate bonding pads; and
   an encapsulating resin provided around the bonding wires and the semiconductor chip.

2. The semiconductor device of claim 1, wherein the first surface of the substrate has an asperity.

3. The semiconductor device of claim 1, wherein the substrate includes a surface with an asperity in a range of from about 1 μm to about 10 μm.

4. The semiconductor device of claim 1, wherein each of the first and second adhesive layer is one of an epoxy resin and a polyaramid resin, and the first and second adhesive layers have a thickness in a range of from about 5 μm to about 20 μm on the substrate.

5. The semiconductor device of claim 1, wherein the third adhesive layer is one of an epoxy resin and a silicone resin, and the third adhesive layer has a film thickness of from about 25 μm to about 100 μm on the first adhesive layer.

6. The semiconductor device of claim 1, wherein the outer contour of the third adhesive layer is aligned with a contour of the semiconductor chip.

7. The semiconductor device of claim 1, wherein a film thickness of the first and second adhesive layers is thinner than a film thickness of the third adhesive layer.

8. The semiconductor device of claim 1, wherein the first adhesive layer has an asperity on a surface thereof.

9. The semiconductor device of claim 1, wherein the first adhesive layer has an asperity with a height of from about 0.1 μm to about 5.0 μm on a surface thereof.

* * * * *